United States Patent
Lin et al.

(10) Patent No.: US 10,476,998 B2
(45) Date of Patent: Nov. 12, 2019

(54) REINFORCED LIST DECODING

(71) Applicant: QUALCOMM Incorporated, San Diego, CA (US)

(72) Inventors: Jamie Menjay Lin, San Diego, CA (US); Yang Yang, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 15/619,115

(22) Filed: Jun. 9, 2017

(65) Prior Publication Data
US 2018/0013868 A1    Jan. 11, 2018

Related U.S. Application Data

(60) Provisional application No. 62/360,734, filed on Jul. 11, 2016.

(51) Int. Cl.
*H04L 29/08*     (2006.01)
*H04W 72/04*   (2009.01)
(Continued)

(52) U.S. Cl.
CPC ...... *H04L 69/324* (2013.01); *H03M 13/2906* (2013.01); *H03M 13/3738* (2013.01);
(Continued)

(58) Field of Classification Search
None
See application file for complete search history.

(56) References Cited

U.S. PATENT DOCUMENTS 5,673,291 A * 9/1997 Dent ................. H03M 13/2721
                                                           329/304
2010/0095189 A1* 4/2010 Park ................. H03M 13/3723
                                                           714/794
(Continued)

FOREIGN PATENT DOCUMENTS

EP        0728393 A1     8/1996

OTHER PUBLICATIONS

Chen et al, List Viterbi Algorithms for Continuous Transmission, IEEE (Year: 2001).*

(Continued)

*Primary Examiner* — Yaotang Wang
(74) *Attorney, Agent, or Firm* — Steven R. Thiel; Patterson & Sheridan LLP

(57) ABSTRACT

Certain aspects of the present disclosure relate to techniques and apparatus for increasing decoding performance and/or reducing decoding complexity. A transmitter may divide data of a codeword into two or more sections and then calculate redundancy check information (e.g., a cyclic redundancy check or a parity check) for each section and attach the redundancy check information to the codeword. A decoder of a receiver may decode each section of the codeword and check the decoding against the corresponding redundancy check information. If decoding of a section fails, the decoder may use information regarding section(s) that the decoder successfully decoded in re-attempting to decode the section(s) that failed decoding. In addition, the decoder may use a different technique to decode the section(s) that failed decoding. If the decoder is still unsuccessful in decoding the section(s), then the receiver may request retransmission of the failed section(s) or of the entire codeword.

28 Claims, 17 Drawing Sheets

(51) Int. Cl.
  *H04W 72/08* (2009.01)
  *H04L 12/26* (2006.01)
  *H03M 13/29* (2006.01)
  *H03M 13/37* (2006.01)
  *H03M 13/41* (2006.01)
  *H03M 13/09* (2006.01)
  *H04L 1/00* (2006.01)
  *H03M 13/00* (2006.01)

(52) U.S. Cl.
  CPC ... *H03M 13/3746* (2013.01); *H03M 13/3753* (2013.01); *H03M 13/413* (2013.01); *H03M 13/4123* (2013.01); *H04L 1/0054* (2013.01); *H04L 1/0059* (2013.01); *H04L 1/0061* (2013.01); *H04L 43/16* (2013.01); *H04W 72/0466* (2013.01); *H04W 72/085* (2013.01); *H03M 13/09* (2013.01); *H03M 13/4115* (2013.01); *H03M 13/4169* (2013.01); *H03M 13/6502* (2013.01)

(56) References Cited

U.S. PATENT DOCUMENTS

| | | | |
|---|---|---|---|
| 2011/0099455 A1* | 4/2011 | Kamuf | H03M 13/3723 714/755 |
| 2011/0154143 A1* | 6/2011 | Eckert | H04L 1/1812 714/748 |
| 2011/0206170 A1 | 8/2011 | Wilborn et al. | |
| 2011/0255631 A1* | 10/2011 | Pi | H03M 13/09 375/295 |
| 2012/0036416 A1* | 2/2012 | Wang | H03M 13/4115 714/795 |

OTHER PUBLICATIONS

Chen B., et al., "List Viterbi Algorithms for Continuous Transmission", IEEE Transactions on Communications, vol. 49 No. 5, pp. 784-792, May 2001.
International Search Report and Written Opinion—PCT/US2017/036911—ISA/EPO—dated Sep. 25, 2017.

* cited by examiner

Convolutional Code (CC)

Information bit stream: 1 1 0 0 1 0 1 0

Encoding process: [0 0 0 1] 1 0 0 1 0 1 0 0 0 0 → coded bit 1,2,3

0 [0 0 1 1] 0 0 1 0 1 0 0 0 0 → coded bit 4,5,6

0 0 [0 1 1 0] 0 1 0 1 0 0 0 0 → coded bit 7,8,9

0 0 0 [1 1 0 0] 1 0 1 0 0 0 0 → coded bit 10,11,12

0 0 0 1 1 0 0 1 0 1 [0 0 0 0] → coded bit 31,32,33

Tail Biting Convolutional Code (TBCC)

Viterbi Algorithm For TBCC

Viterbi Algorithm For TBCC (cont')

1. Start with equal weight for each state in the first iteration
2. At the end of the trellis construction, identify a number of best states
3. Take the back trace output over a certain range of stages for the decoded bits State 0: red_check = f(0) = {0, 0} ─────────

State 1: red_check = f(1) = {0, 1} ∙∙∙∙∙∙∙∙∙

State 2: red_check = f(2) = {1, 0} ─ ─ ─ ─ ─

State 3: red_check = f(3) = {1, 1} ─∙─∙─∙─∙─

REINFORCED LIST DECODING

CROSS-REFERENCE TO RELATED APPLICATIONS

The present application for patent claims priority to U.S. Provisional Application No. 62/360,734, filed Jul. 11, 2016, which is assigned to the assignee of the present application and hereby expressly incorporated by reference herein in its entirety.

BACKGROUND

Field of the Invention

Certain aspects of the present disclosure generally relate to wireless communications and, more particularly, to a method and apparatus for reinforced list decoding of transmitted codewords with sectional redundancy checks.

Description of Related Art

In a typical transmitter of a modern wireless communication system, an output sequence of bits from an error correcting code can be mapped onto a sequence of complex modulation symbols. These symbols can be then used to create a waveform suitable for transmission across a wireless channel. A receiver of the transmission may decode the transmission to recover data bits from the transmission. Particularly as data rates increase, decoding performance on the receiver side can be a limiting factor to achievable data rates. This may be because in currently known decoding techniques, interference with reception of a portion (e.g., one subcarrier of a resource block) of a codeword may cause a decoder to declare a decoding failure of the entire codeword, even if the interference did not affect most of the codeword. If the decoder declares a failure in decoding the codeword, then the receiver typically requests retransmission of the entire codeword. Time spent requesting retransmission of a codeword and time used for retransmission of the codeword may reduce data throughput of the communication link and/or increase latency of the communication link.

SUMMARY

Certain aspects of the present disclosure provide techniques and apparatus for reinforced list decoding of transmissions with sectional redundancy checks. A transmitter may divide data of a codeword into two or more sections and then calculate redundancy check information (e.g., a cyclic redundancy check or a parity check) for each section and attach the redundancy check information to the codeword. A decoder of a receiver receiving the codeword may decode each section of the codeword and check the decoding against the corresponding redundancy check information. If decoding of a section fails, the decoder may use information regarding section(s) that the decoder successfully decoded in re-attempting to decode the section(s) that failed decoding. In addition, the decoder may use a different technique to decode the section(s) that failed decoding. If the decoder is still unsuccessful in decoding the section(s), then the receiver may request retransmission of the failed section(s) or of the entire codeword.

Certain aspects of the present disclosure provide a method for wireless communications performed by an apparatus. The method generally includes receiving a codeword comprising a plurality of sections, each section having redundancy check information, attempting to decode at least one of the plurality of sections of the codeword, verifying a first one or more of the sections was properly decoded based on corresponding redundancy check information, and re-attempting to decode a second one or more sections that were not properly decoded using information from at least one of the first sections that was properly decoded.

Certain aspects of the present disclosure provide an apparatus for wireless communications. The apparatus generally includes means for receiving a codeword comprising a plurality of sections, each section having redundancy check information, means for attempting to decode at least one of the plurality of sections of the codeword, means for verifying a first one or more of the sections was properly decoded based on corresponding redundancy check information, and means for re-attempting to decode a second one or more sections that were not properly decoded using information from at least one of the first sections that was properly decoded.

Certain aspects of the present disclosure provide an apparatus for wireless communications. The apparatus generally includes a processing system configured to receive a codeword comprising a plurality of sections, each section having redundancy check information, to attempt to decode at least one of the plurality of sections of the codeword, to verify a first one or more of the sections was properly decoded based on corresponding redundancy check information, and to re-attempt to decode a second one or more sections that were not properly decoded, using information from at least one of the first sections that was properly decoded; and a memory coupled with the processing system.

Certain aspects of the present disclosure provide a computer-readable medium for wireless communications comprising instructions. The instructions, when executed by a processing system, cause the processing system to execute operations generally including receiving a codeword comprising a plurality of sections, each section having redundancy check information, attempting to decode at least one of the plurality of sections of the codeword, verifying a first one or more of the sections was properly decoded based on corresponding redundancy check information, and re-attempting to decode a second one or more sections that were not properly decoded, using information from at least one of the first sections that was properly decoded.

The techniques may be embodied in methods, apparatuses, and computer program products.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate certain typical aspects of this disclosure and are therefore not to be considered limiting of its scope, for the description may admit to other equally effective aspects.

DETAILED DESCRIPTION

Figure 1:
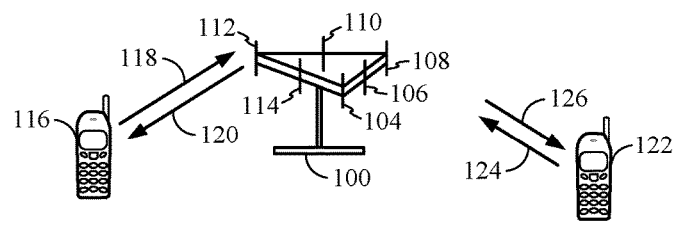
FIG. 1 illustrates an example wireless communication system in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point 100 (AP) may include multiple antenna groups, one group including antennas 104 and 106, another group including antennas 108 and 110, and an additional group including antennas 112 and 114. In FIG. 1, two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
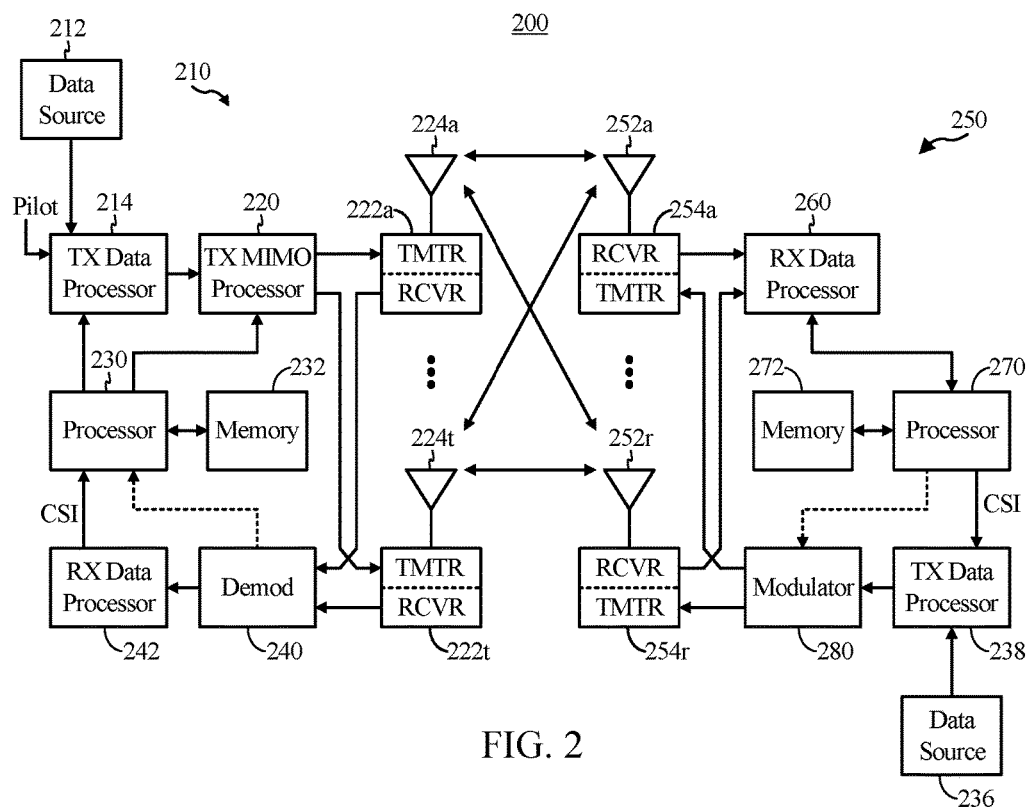
FIG. 2 illustrates a block diagram of an access point and a user terminal in accordance with certain aspects of the present disclosure.

FIG. 2 illustrates a block diagram of an aspect of a transmitter system 210 (e.g., also known as the access point) and a receiver system 250 (e.g., also known as the access terminal) in a wireless communications system, for example, a MIMO system 200. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230. Memory 232 may store data and program codes for the transmitter system 210 and may interface with the processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software for the receiver system 250 and may interface with the processor 270. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
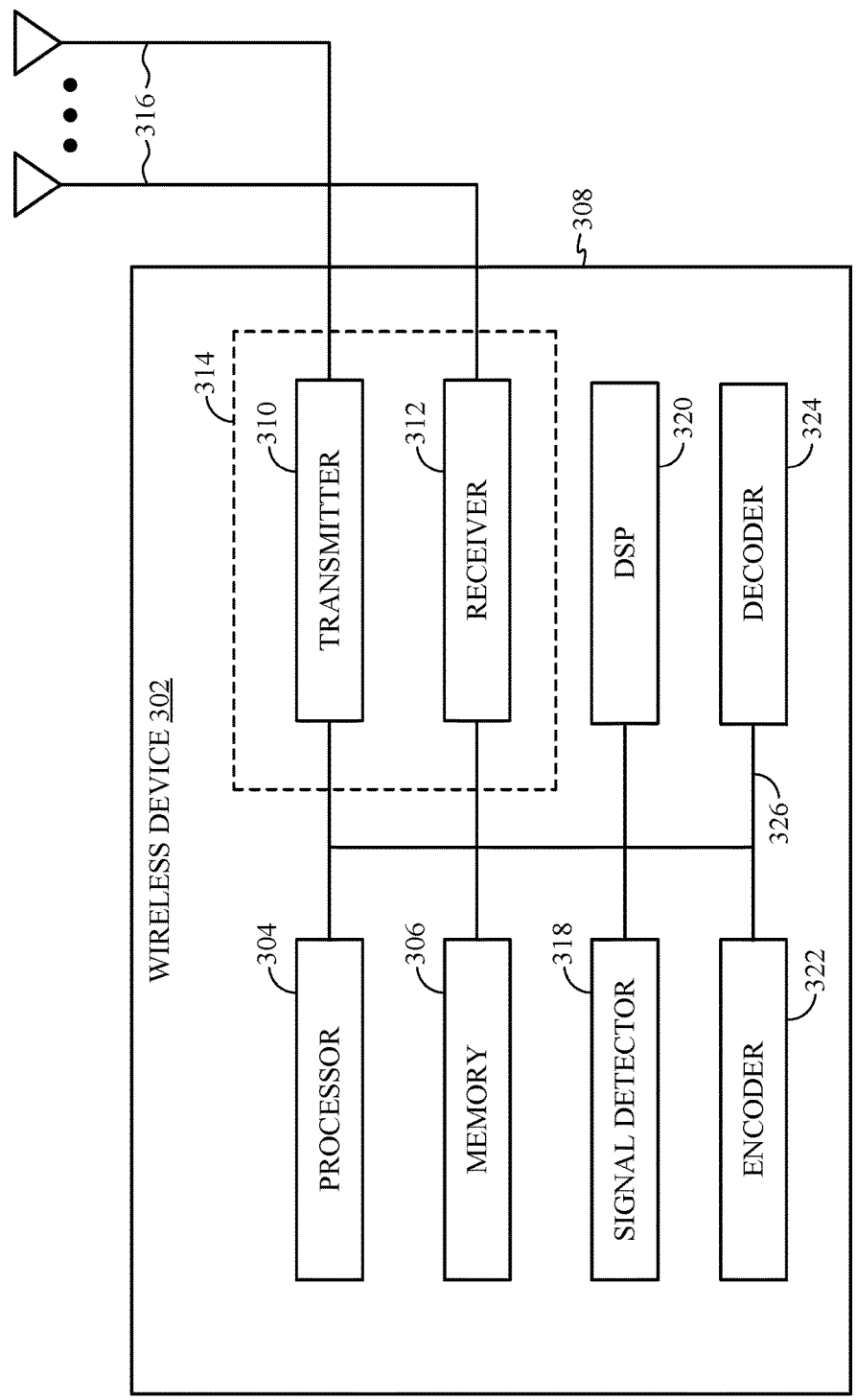
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. The wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single transmit antenna or a plurality of transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals.

The various components of the wireless device 302 may be coupled together by a bus system 326, which may include a power bus, a control signal bus, and a status signal bus in addition to a data bus.

Figure 4:
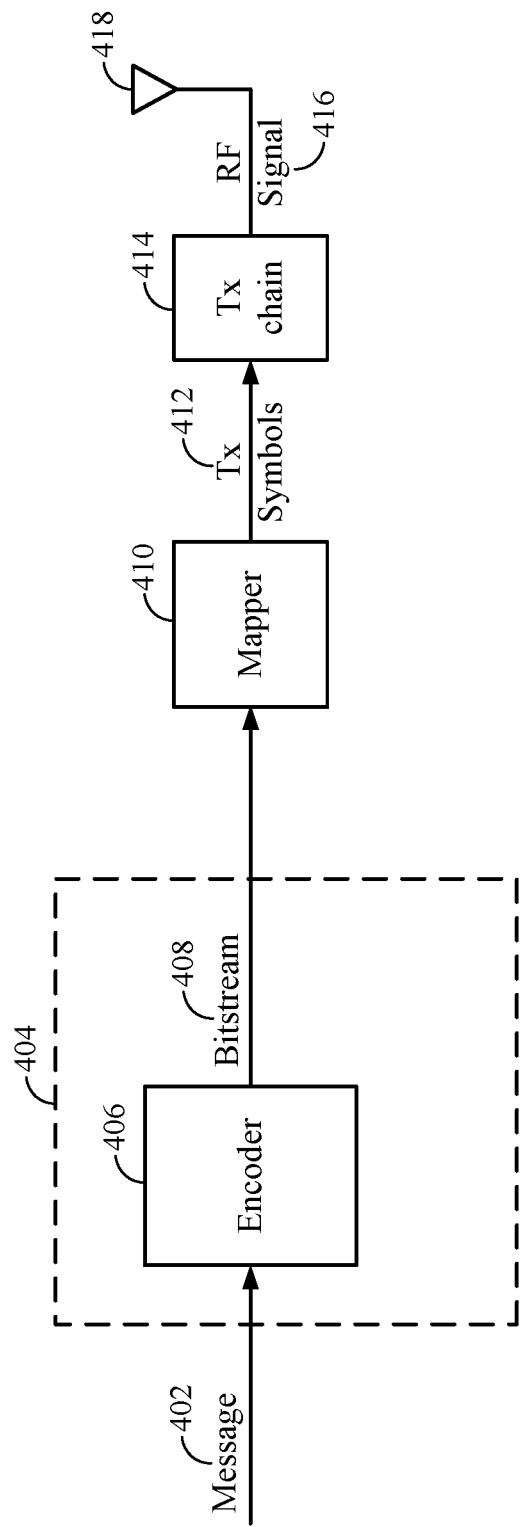
FIG. 4 is a simplified block diagram illustrating a decoder, in accordance with certain aspects of the present disclosure.

FIG. 4 is a simplified block diagram illustrating an encoder, in accordance with certain aspects of the present disclosure. According to certain aspects, the encoder 322 illustrated in FIG. 3 may comprise the encoder illustrated in FIG. 4. FIG. 4 illustrates a portion of a radio frequency (RF) modem 404 that may be configured to provide an encoded message for wireless transmission. In one example, an encoder 406 in a base station (e.g., BS 110 and/or 210) (or an access terminal on the reverse path) receives a message 402 for transmission. The message 402 may contain data and/or encoded voice or other content directed to the receiving device. The encoder 406 encodes the message using a suitable modulation and coding scheme (MCS), typically selected based on a configuration defined by the base station 110/210 or another network entity. In some cases, the encoder 406 may encode the message using techniques described below (e.g., by using a convolutional code). An encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
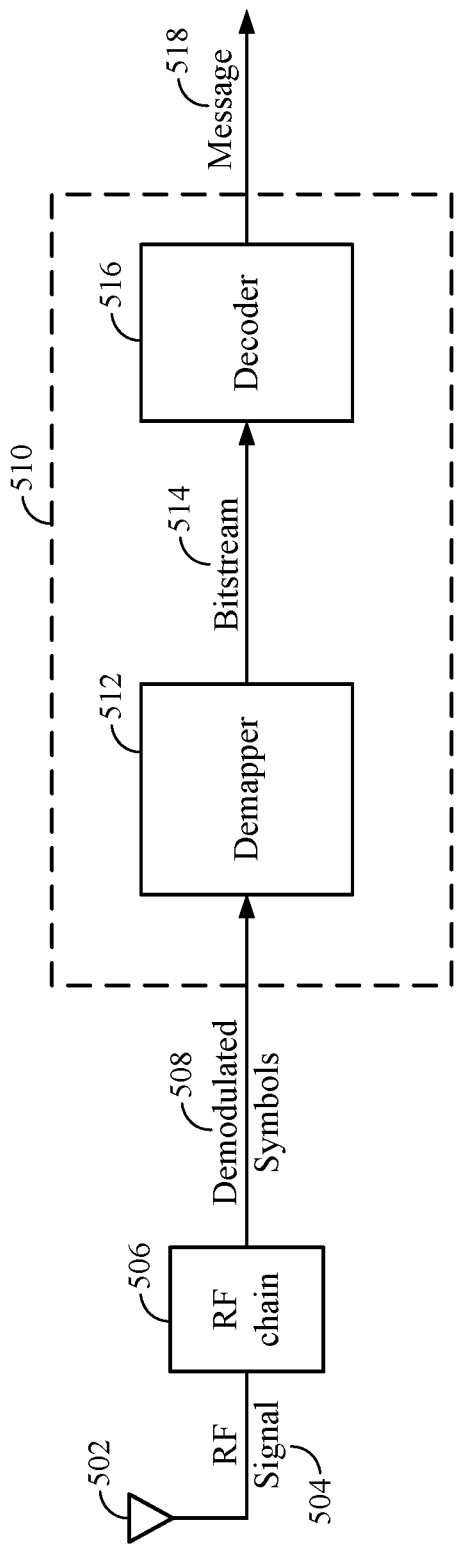
FIG. 5 is a simplified block diagram illustrating a decoder, in accordance with certain aspects of the present disclosure.

FIG. 5 is a simplified block diagram illustrating a decoder, in accordance with certain aspects of the present disclosure. According to certain aspects, the decoder 324 illustrated in FIG. 3 may comprise the decoder illustrated in FIG. 5. FIG. 5 illustrates a portion of a RF modem 510 that may be configured to receive and decode a wirelessly transmitted signal including an encoded message (e.g., a message encoded using a convolutional code as described below). In various examples, the modem 510 receiving the signal may reside at the access terminal, at the base station, or at any other suitable apparatus or means for carrying out the described functions. An antenna 502 provides an RF signal 504 (e.g., the RF signal 416 produced in FIG. 4) to an access terminal (e.g., access terminal 116, 118, and/or 250). An RF chain 506 processes and demodulates the RF signal 504 and may provide a sequence of symbols 508 to a demapper 512, which produces a bitstream 514 representative of the encoded message.

A decoder 516 may then be used to decode m-bit information strings from a bitstream that has been encoded using a coding scheme (e.g., a convolutional code). The decoder 516 may comprise a Viterbi decoder, an algebraic decoder, a butterfly decoder, or another suitable decoder. A decoder may be used to decode a bitstream encoded by a code such as a trellis or a convolutional code. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., BS 110 and/or 210). The decoder may decode the bitstream 514 in accordance with aspects of the present disclosure presented below.

Example Convolutional Coding

Figures 6, 7:
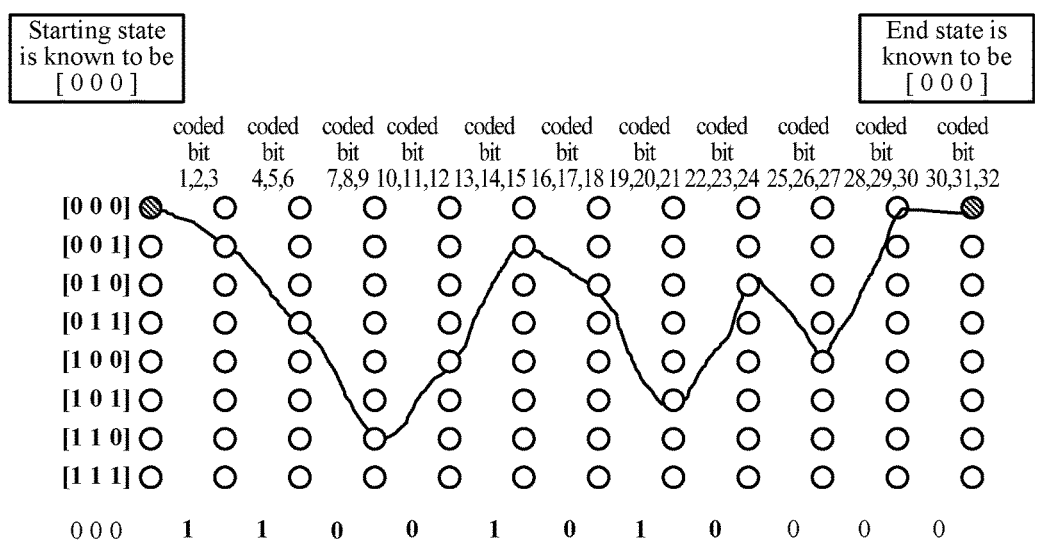
FIG. 6 illustrates an example of convolutional coding.
FIG. 7 illustrates an example of a Viterbi algorithm for decoding a convolutionally coded bit stream.

According to certain aspects, a convolutional coding algorithm may be used (e.g., by an encoder 322) to encode a stream of bits, to generate an encoded codeword. FIG. 6 illustrates an example of convolutional coding, in which a stream of information bits is encoded. As illustrated, the encoding may start with a known sequence of bits (e.g., 000 in this example) and each encoded bit may be generated as a function of the previous bits. The same known sequence of bits is appended at the end.

As illustrated in FIG. 7, the encoded codeword may be decoded using a Trellis structure (e.g., by a decoder 324). A code trellis is a graphical representation of a block or code where a code word (or a code sequence) is represented by every path. Each stage in the Trellis has one of several states (e.g., 8 states if each bit is encoded based on previous three bits). Each transition from one stage to the other is a function of the previous bits and the "new" bit being encoded. In the illustrated example, since the first bit is a "1" the transition is from the state "000" in the first stage to the state "001" in the second stage (then from the "001" state in the second stage to "011" in the third stage . . . ). Thus there are a limited number of valid decoding paths through the Trellis. As described above, and as illustrated in FIG. 7, the starting state and ending state are both known, a fact that may be exploited when decoding (e.g., any decoding paths through the Trellis that do not begin and end with the known state can be disqualified).

Figure 8:
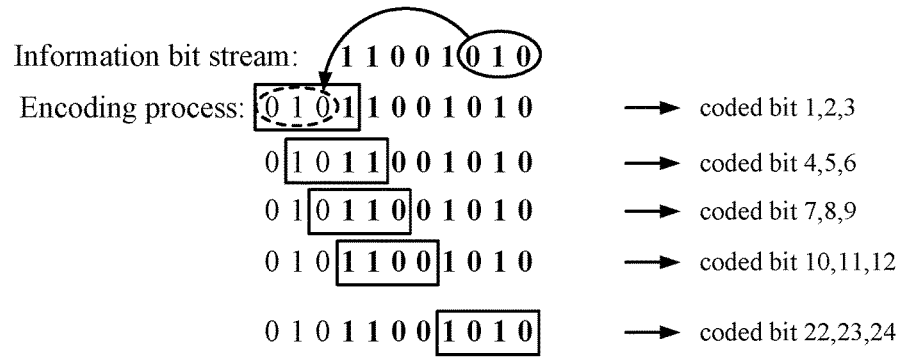
FIG. 8 illustrates an example of encoding via a tail biting convolutional code (TBCC).
Figure 9:
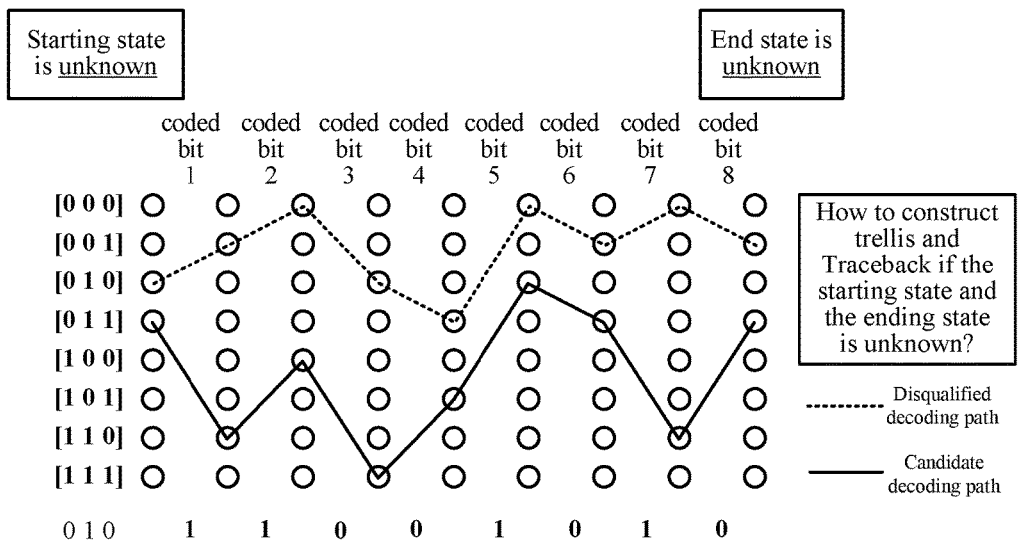
FIG. 9 illustrates an example of a Viterbi algorithm for decoding a TBCC encoded bit stream.

FIG. 8 illustrates an example of encoding via a tail biting convolutional code (TBCC). The TBCC algorithm is named such because bits at the "tail" end of the bit stream are appended to the start of the encoded bit stream. Thus, in this case, the starting and ending states are the same (as in FIG. 7), but the state is not fixed (rather it depends on the value of the tail bits). In the illustrated example, the value of the tail bits (and thus starting and end states) is "010." Both encoding and decoding of information data is performed in a blockwise manner when a TBCC is used. "Tailbiting" is used to highlight that the encoder's starting and ending states are identical. The decoder does not know the initial decoding state. Therefore, in order for a TBCC to perform efficiently, the decoder should be able to accurately and quickly determine the initial decoding state. Thus, as illustrated by the solid line in FIG. 9, since the first bit is a "1" the transition is from the starting state "010" in the first stage to the state "101" in the second stage (then from the "101" state in the second stage to "011" in the third stage, etc.). Using a TBCC decoding Trellis, as illustrated in FIG. 9, any decoding paths that do not begin and end at the same state (although initially unknown) may be disqualified. For example, assume again the starting state is "010". In this example, however, illustrated by the dashed line in FIG. 9, the starting state (i.e., "010") does not match the ending state (e.g., "001"). Thus, this decoding path may be disqualified.

Figure 10:
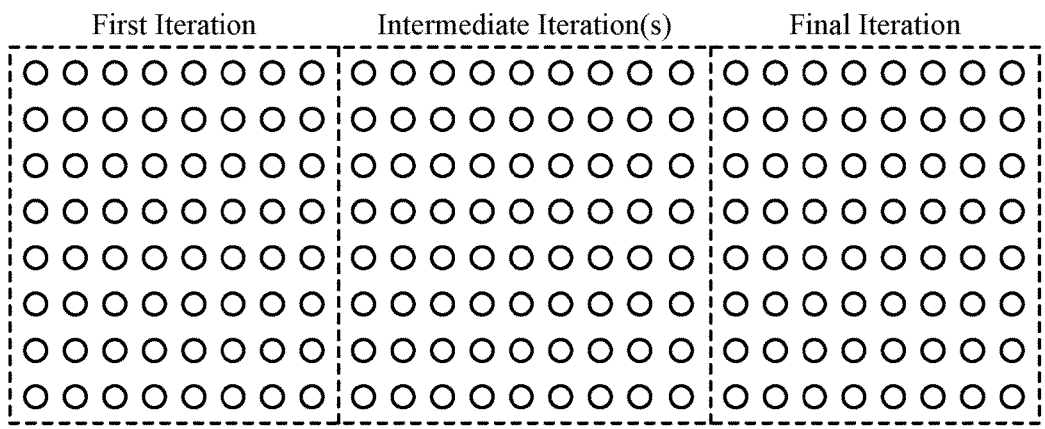
FIG. 10 illustrates an example iterative process of a Viterbi algorithm for decoding a TBCC encoded bit stream.

As illustrated in FIG. 10, one algorithm for decoding a TBCC encoded codeword is through a series of iterations. In a first iteration, each state may start with equal weight. At the end of the trellis construction, the decoder may identify a number of best states, then perform a back trace output over a certain range of stages for the decoded bits and select a decoding path based on metrics generated during these iterations to derive decoded bits.

Example CC/TBCC with Sectional Redundancy Check

In legacy communication standards with convolutional coding (CC) and/or tail biting convolutional coding (TBCC), a cyclic redundancy check (CRC) is typically used as part of the pre-encoded bits to help detect error in a decoded payload. An N-bit cyclic redundancy check can naturally provide an expected false detection rate at $2^{-N}$. However, other than the error detection provided by the "global" CRC (i.e., one CRC for the payload), the legacy approach fails to provide additional insights into error symptoms of a transmission.

Aspects of the present disclosure present techniques for providing additional insights into error symptoms of a transmission without changing a total number of redundancy check bits and payload bits from previously known techniques. The additional insights could benefit a decoder by enabling sophisticated handling by the decoder that may achieve improved code block error rate performance and/or reduce decoding complexity, while maintaining unaffected overall false detection rates. That is, aspects of the present disclosure provide a new code structure that enables the use of error symptom insights to increase decoding performance and/or reduce decoding complexity, for example, by partitioning a payload into a plurality of sections and deriving redundancy check information for each of the sections.

Figure 11:
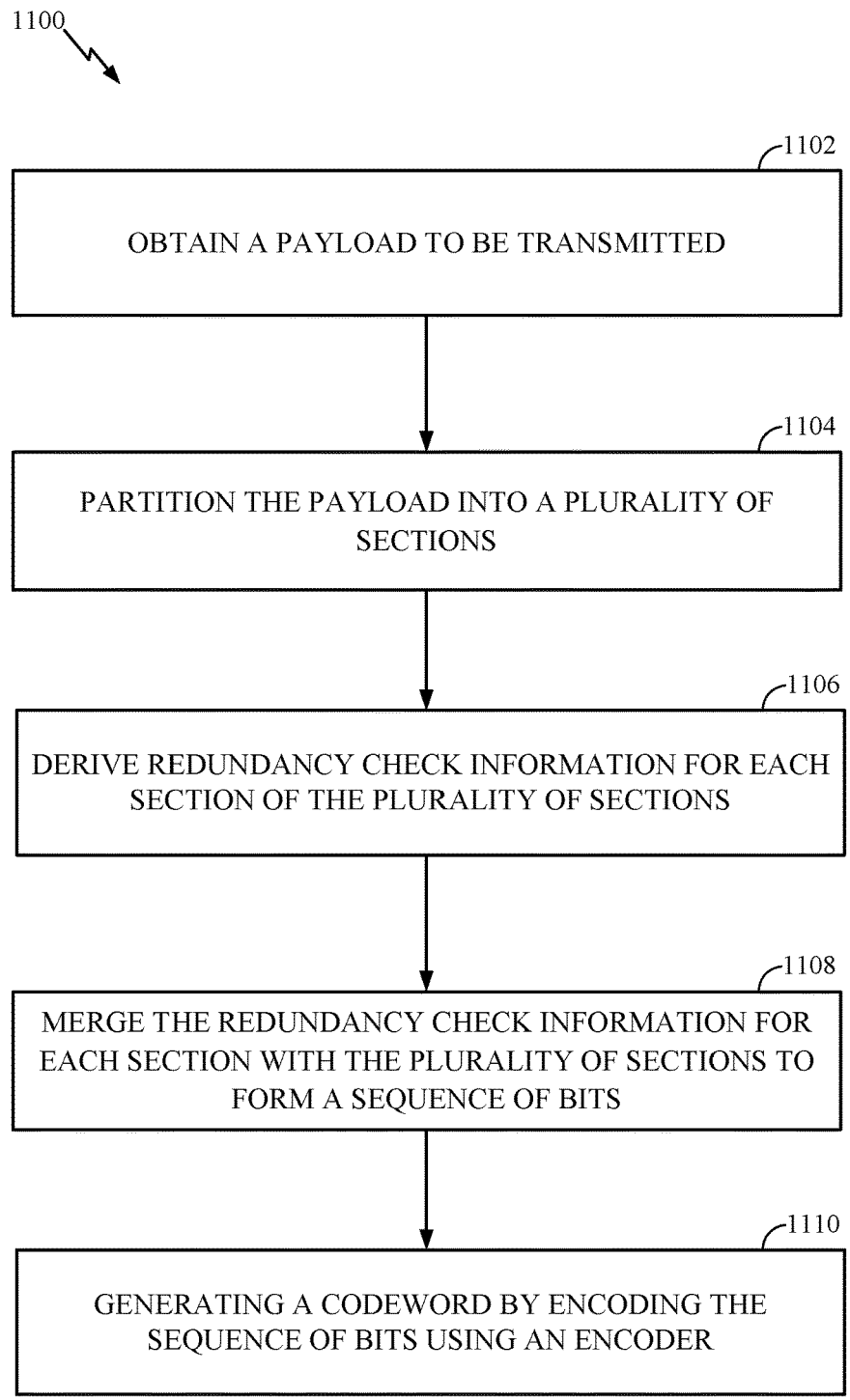
FIG. 11 illustrates example operations for wireless communications, in accordance with certain aspects of the present disclosure.

FIG. 11 illustrates example operations 1100 for wireless communications, for example, for increasing decoding performance and/or reducing decoding complexity. According to certain aspects, operations 1100 may be performed by a wireless transmission device (e.g., wireless device 302, shown in FIG. 3).

Operations 1100 begin at 1102 with obtaining a payload to be transmitted. For example, processor 304 of wireless device 302 may obtain a payload to be transmitted by executing a program to generate a packet of data based on other inputs.

At 1104, the wireless transmission device partitions the payload into a plurality of sections. Continuing the example from above, the processor of wireless device may partition the payload (e.g., the packet) into four sections.

At 1106, the wireless transmission device derives redundancy check information for each section of the plurality of sections. Still in the example, the processor of wireless device may generate a CRC for each of the four sections.

At 1108, the wireless transmission device merges the redundancy check information for each section with the plurality of sections to form a sequence of bits. Continuing the example, the processor of wireless device may interleave the sections of the payload with the CRCs using one of the techniques shown in FIG. 12, such as the technique illustrated at 1202, to form a sequence of bits.

At 1110, the wireless transmission device generates a codeword by encoding the sequence of bits using an encoder. For example, the decoder 324 of wireless device 302 may generate a codeword by encoding the sequence of bits using a convolution code, a tail-biting convolution code, or a polar code.

While not illustrated, operations 1100 may also include the wireless transmission device transmitting the codeword to a wireless reception device for decoding. Continuing the example, the transmitter 310 of wireless device 302 may transmit the codeword via one or more of the antennas 316.

As noted above, a payload (not including a CRC and/or parity check bits) may be first partitioned by a wireless transmission device into N sections to form a "P" (i.e., payload) sequence: $\{P_0, P_1, \ldots, P_{N-1}\}$.

According to certain aspects of the present disclosure, each section may then be used by the wireless transmission device to independently derive redundancy check information corresponding to that section. According to certain aspects of the present disclosure, the redundancy check information may be used by a wireless reception device (e.g., a separate wireless device 302) during decoding in order to determine whether sections of a codeword are decoded properly, for example, as explained below in greater detail.

In some cases, the redundancy check information may comprise an error detection code, such as a "sectional" CRC, known as a sectional decoded redundancy check (SDRC). In other cases, the redundancy check information may comprise parity information, for example, as described in greater detail below. In yet other cases, the redundancy check information may comprise information usable by a list decoder for determining one or more most-likely decoding paths through trellis stages of the list decoder, known as a sectional in-trellis redundancy check (SITRC).

According to certain aspects of the present disclosure, for an SDRC, the wireless transmission device may independently derive a "sectional" CRC for each section of the payload to form a "C" (i.e., CRC) sequence: $\{C_0, C_1, \ldots, C_{N-1}\}$. In some cases, there may also be a field for a global CRC for the payload, which may be derived (by the wireless transmission device) from the multi-sectional payload (i.e., the P sequence) and may be included in the C sequence. In some cases, the global CRC may be derived from the multi-sectional payload and the sectional CRCs.

Additionally, according to certain aspects, other variations of sectional CRC are possible. For example, the sectional coverage of the redundancy check may be defined such that $C_0$ covers $\{P_0\}$, $C_1$ covers $\{P_0, P_1\}$, and so on. Further, it should be noted that variations of sectional parity check other than CRC are also possible for use in narrowing a list of decoding candidates.

According to certain aspects of the present disclosure, an advantage of having sectional CRCs used in the manner described above (e.g., covering corresponding sections of the payload) is that a decoder (e.g., at a wireless reception device receiving a codeword) may determine whether individual sections of a codeword are received/decoded correctly, whereas in the legacy case (i.e., one single 16-bit global CRC for a payload), a failed global CRC indicates the entire payload was incorrectly received/decoded. This may allow a wireless reception device to transmit a request to the wireless transmission device to retransmit a particular section of codeword. Additionally, due to the flat bit error rate (BER) behavior of TBCC, sectional CRC may be evenly covered within the payload.

Figure 12:
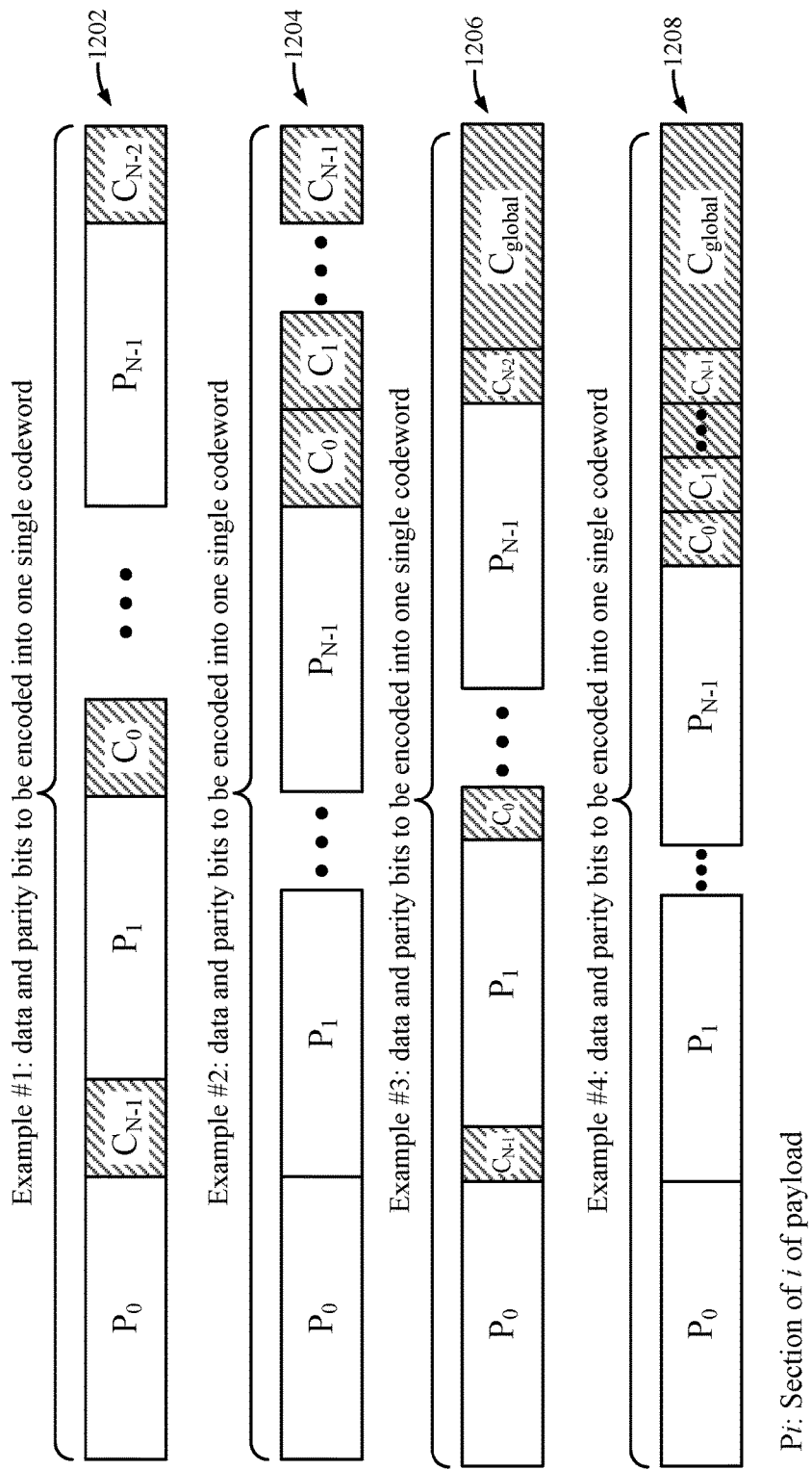
FIG. 12 illustrates exemplary interleaving/concatenation patterns for redundancy check information, in accordance with certain aspects of the present disclosure.

According to certain aspects of the present disclosure, the wireless transmission device may then merge (e.g., by interleaving and/or concatenating) the P and C sequences to form a new sequence of bits, for example, as illustrated in FIG. 12. According to certain aspects, the interleaving/concatenation may comprise different patterns. For example, as illustrated at 1202, to form the new sequence, a first section of the payload may be concatenated with a sectional CRC for a final section of the payload, and the first section of the payload and the sectional CRC for the final section may then be concatenated to a second section of the payload and a sectional CRC for the first section of the payload, etc. In some cases (e.g., at 1206), a global CRC may be concatenated at the end of this new sequence.

Additionally or alternatively, to form the new sequence, each section of the payload may be concatenated together to form a sectional portion and then the sectional CRCs for each section may be concatenated on the end of the sectional portion, for example, as illustrated at 1204. In some cases (e.g., at 1208), a global CRC may be concatenated to the sectional portion and the sectional CRCs at the end of this new sequence.

It should be noted that, regarding the interleaving/concatenation pattern(s) (e.g., as described above), certain choices of pattern may create separation in the sequence between $P_k$ and $C_k$ for a given k, which may be useful for CRC error detection due to a relationship between code constraint length and the typical bit length of one single error symptom. In other words, separating $P_k$ and $C_k$ for any given k may allow time for a transient error (e.g., caused by transient interference) affecting one of $P_k$ and $C_k$ to end before it affects the other, thus preventing one transient error from affecting both a payload section and a CRC section for that payload section.

According to aspects of the present disclosure, the interleaving and/or concatenating pattern may be based on a relationship between a code constraint length and a bit length of a defined error symptom.

It should also be noted that a total number of bits used for sectional CRCs may be the same as a total number of bits used in the legacy case (i.e., the case of having a global CRC and no sectional CRCs). For example, in the legacy case, the global CRC may comprise 16 bits. Here, with reference to the example concatenation in 1208, assuming the number of sections for pre-encoded data or CRC is 2 (i.e., two payload sections and a sectional CRC for each section), the two sectional CRCs (e.g., $C_0$ and $C_1$) may comprise 6 bits and the single global CRC (e.g., $CRC_{Global}$) may comprise 4 bits. Thus, the total number of bits used for the sectional and global CRCs is still 16 bits.

According to certain aspects of the present disclosure, the resultant concatenated and/or interleaved sequence of bits (i.e., the merged P and C sequences) may then be encoded by the wireless transmission device using an encoder (e.g., as illustrated in FIG. 5) into one single codeword, for example, using a convolutional code (CC) encoding scheme, tail biting convolutional code (TBCC) encoding scheme, polar encoding scheme, or any other suitable coding scheme.

The codeword may then be transmitted by the wireless transmission device over a wireless medium and received by a wireless reception device for decoding, for example, as explained below.

Figure 13:
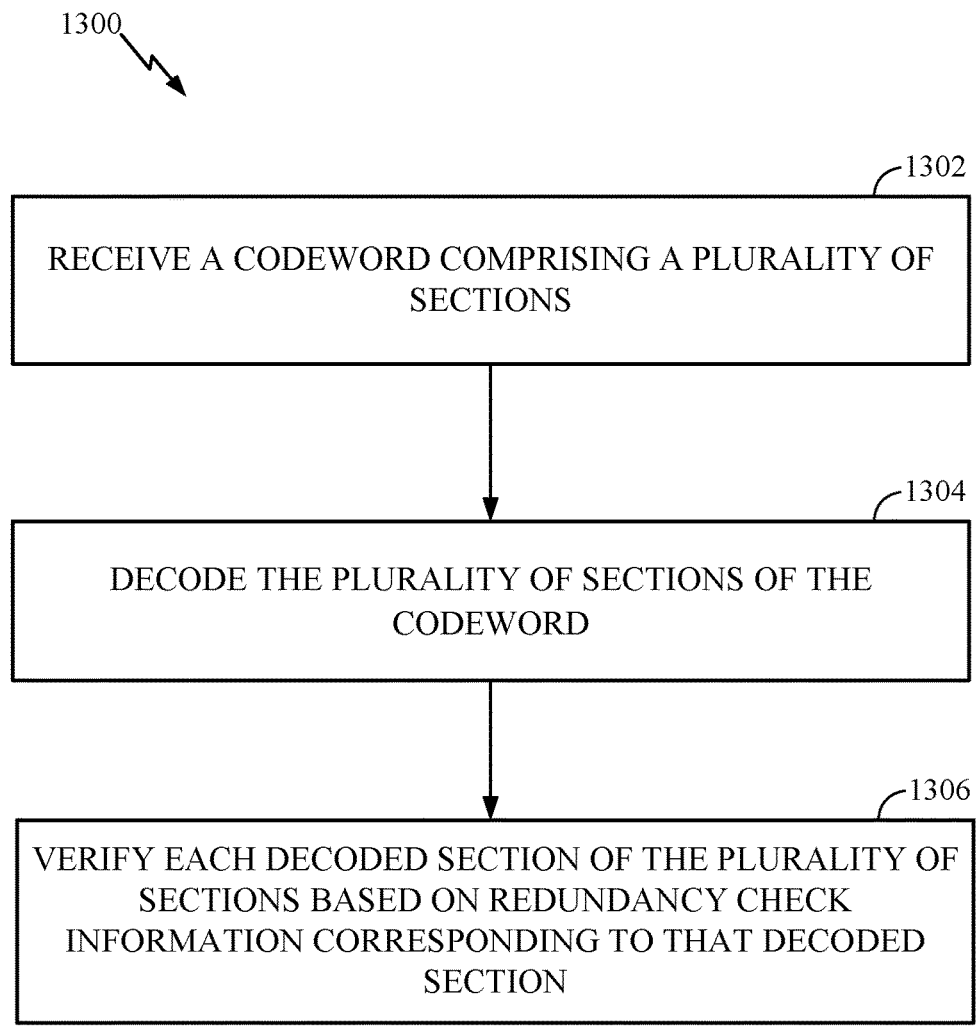
FIG. 13 illustrates example operations for wireless communications, in accordance with certain aspects of the present disclosure.

FIG. 13 illustrates example operations 1300 for wireless communications, for example, for increasing decoding performance and/or reducing decoding complexity. According to certain aspects, operations 1300 may be performed by a wireless reception device (e.g., wireless device 302). According to certain aspects of the present disclosure, operations 1300 may be complimentary to the operations 1100. For example, operations 1100 may be performed by wireless transmission device (e.g., access terminal 116, shown in FIG. 1) for generating (and transmitting) a codeword and operations 1300 may be performed by a wireless reception device (e.g., access point 100, shown in FIG. 1) for receiving and decoding the codeword.

Operations 1300 begin at 1302 by receiving a codeword comprising a plurality of sections. For example, receiver 312 of wireless device 302 may receive a codeword via one or more antennas 316, and the codeword may comprise a plurality of sections.

At 1304, the wireless reception device decodes the plurality of sections of the code word. Continuing the example, decoder 324 of wireless device 302 may decode each of the plurality of sections of the codeword.

At 1306, the wireless reception device verifies each decoded section of the plurality of sections based on redundancy check information corresponding to that decoded section. Still in the example from above, the decoder 324 or the processor 304 of the wireless device 302 may verify each decoded section of the codeword, based on redundancy check information (e.g., CRC or parity check information) corresponding to that section of the codeword.

As noted above, the redundancy check information may comprise error correction codes, such as sectional CRCs, derived for different sections of a payload. According to certain aspects of the present disclosure, the wireless reception device may decode the received codeword that comprises a plurality of sections, and the wireless reception device may verify that each section of the decoded codeword was decoded correctly based on a sectional CRC for each section. Additionally, in some cases, the wireless reception device may verify the decoded codeword based on a global CRC included in the codeword.

As noted above, in some cases, the error detection code comprises parity information, which may be derived from at least one of state information or path information, and wherein at least one of the state information or path information is based on trellis stages of a list decoder in the wireless reception device.

In some cases, the wireless reception device may decode the received codeword based on a technique called sectional in-trellis redundancy check (SITRC), which uses information (i.e., the redundancy check information) in the codeword for determining one or more most-likely decoding paths of sections of a codeword through trellis stages of a list decoder in the wireless reception device.

According to certain aspects of the present disclosure, generating a codeword with redundancy check information comprising SITRC information may be similar to generating a codeword with SDRC information (i.e., sectional CRCs), except that the sectional CRCs may be replaced with sectional path or state derivation logic (i.e., the information for determining one or more most-likely decoding paths) for each section of the codeword. In other words, the redundancy check information for SITRC may comprise the sectional path or state derivation logic for each section of the codeword.

Figure 14:
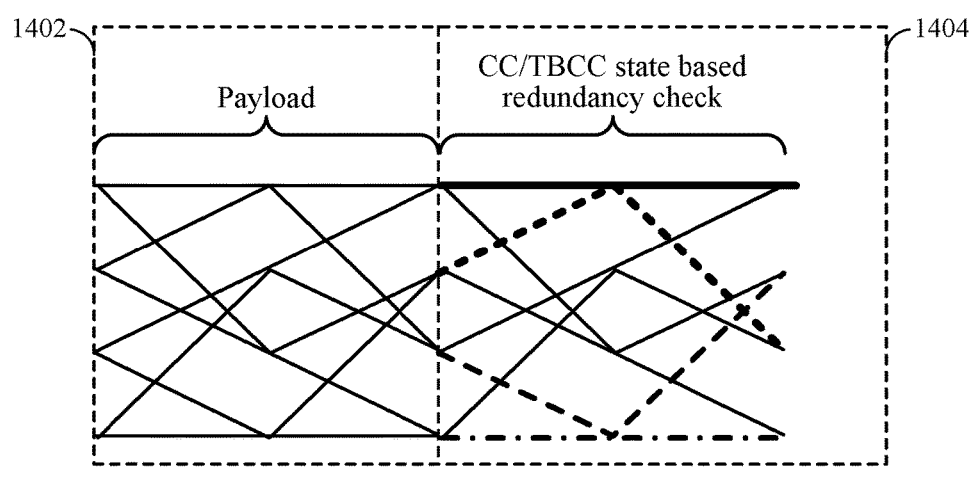
FIG. 14 illustrates an example 4-state CC/TBCC with redundancy check, in accordance with certain aspects of the present disclosure.

FIG. 14 illustrates a 4-state convolutionally coded (CC) or tail-biting convolutionally coded (TBCC) codeword with SITRC derived from an ending memory state. For example, as illustrated in FIG. 14, an SITRC may involve, during decoding of a section of a codeword, the wireless reception device determining a list of possible decoding paths through trellis stages of a list decoder for the first section (e.g., by using the decoding techniques described above), for example, as illustrated at 1402. The wireless reception device may then prune, based on the redundancy check information (e.g., sectional path or state derivation logic), the list of possible decoding paths to determine a list of most-likely decoding paths for the first section, for example, as illustrated at 1404. According to certain aspects of the present disclosure, the list of most-likely decoding paths may then be used to decode the codeword and verify the decoded sections. In some cases, during decoding, if the wireless reception device determines that, for a particular section of the codeword, that there are no likely decoding paths (e.g., all likely decoding paths have been pruned), the wireless reception device may terminate decoding early since no decoding paths will result in the codeword being properly decoded.

According to certain aspects, such SITRC may be achieved by taking input from sectional payload CC and/or TBCC memory state or trellis path info, for example, a pre-defined function, such as: sectional_redundancy_check=f(sectional_payload_memory_state_or_trellis_path_info), for example, as illustrated in FIG. 14.

Figure 15:
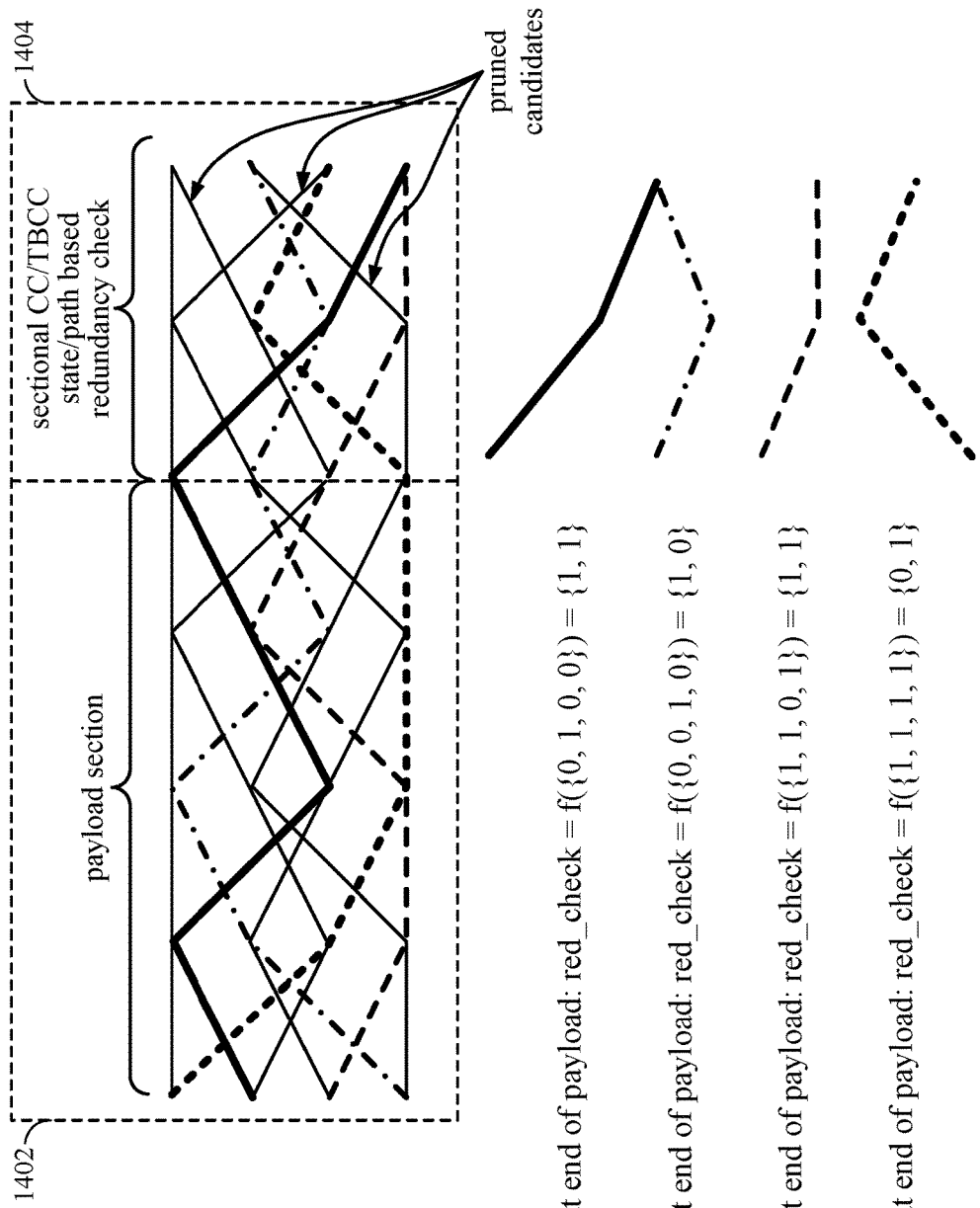
FIG. 15 illustrates an example 4-state CC/TBCC with redundancy check, in accordance with certain aspects of the present disclosure.

FIG. 15 illustrates a 4-state convolutionally coded (CC) codeword or tail biting convolutionally coded (TBCC) codeword with SITRC derived from a 2-bit CRC ($X^2+X^1+1$) over trellis path bits, according to certain aspects of the present disclosure. For example, as illustrated, during decoding of a payload section of a codeword, a wireless reception device may determine a list of possible decoding paths through trellis stages of a list decoder for the first section, for example, as illustrated at 1402. The wireless reception device may then prune the list of possible decoding paths based on state information or path information for that payload section to determine a list of most-likely decoding paths for that payload section.

According to certain aspects of the present disclosure, a primary advantage of SITRC compared to SDRC is the benefit to the decoder in that the redundancy check knowledge may be directly applied during decoder trellis construction by quantitatively reflecting redundancy check in the state metrics. This enables the decoder to make an effort to always find a number of most-likely path candidates prior to deriving decoded bits. SDRC, however, would use a complete decoding procedure before the decoded redundancy check can be applied.

It should be noted that, in some cases, a particular section of a codeword may not be properly decoded. For example, during the verification process, the wireless reception device may determine that one or more sections of the codeword were not decoded properly based on the redundancy check information. In some cases, if the wireless reception device determines that one or more sections of the codeword are not decoded properly, the wireless reception device may transmit a request (e.g., to the wireless transmission device), requesting a re-transmission of those one or more improperly decoded sections. In other cases, the wireless reception device may perform a more advanced decoding operation, using information regarding the one or more sections that were properly decoded, to decode the one or more improperly decoded sections.

Example Reinforced List Decoding

As described in more detail above, the pre-encoded bits of a transmission may follow a field structure such that the source information bits are partitioned into sections, with each section associated with fully or partially independent redundancy error check bits. According to aspects of the present disclosure, a wireless device may use information from sections that were decoded using a first technique in performing a decoding operation via a second technique on sections that were not properly decoded with the first technique.

According to aspects of the present disclosure, a device may first decode each section of a received codeword (that is partitioned into sections, as described above) with a CC, TBCC, or polar decoder using a small list size or list length (e.g., a list size or list length of 1) list Viterbi algorithm (LVA) or a non-LVA technique. A rank ordered list L of globally best candidates is produced by a list Viterbi decoding algorithm (LVA) after a trellis search. The device may then verify the decoded contents of each section using the sectional CRC information for that section. If all of the sections pass their respective sectional CRCs, then the device may declare a decoding success for the entire codeword. If a number of section(s) M, which is less than or equal to a threshold number of sections $M_T$ (i.e., $0<M<=M_T$), fail their respective sectional CRC(s), then the device may perform reinforced list decoding for each failing section, as described in more detail below. A device may derive the threshold number of sections $M_T$ based on a total number of sections N into which a codeword is divided. If performing reinforced list decoding on the M sections that were not verified (e.g., by the sectional CRC information)

gives decoded results such that all sections pass their respective CRCs, then the device may declare a decoding success for the entire codeword. Otherwise, the device declares a decoding failure for the entire codeword and takes appropriate action (e.g., sending a retransmission request for the codeword or the failing section(s)). If the number of section(s) M that fail their respective sectional CRCs is greater than the threshold number of sections $M_T$ (i.e., $M>M_T$), then the device may declare a failure in decoding of the entire codeword and take appropriate action (e.g., sending a retransmission request for the codeword or the failing section(s)).

Figure 16:
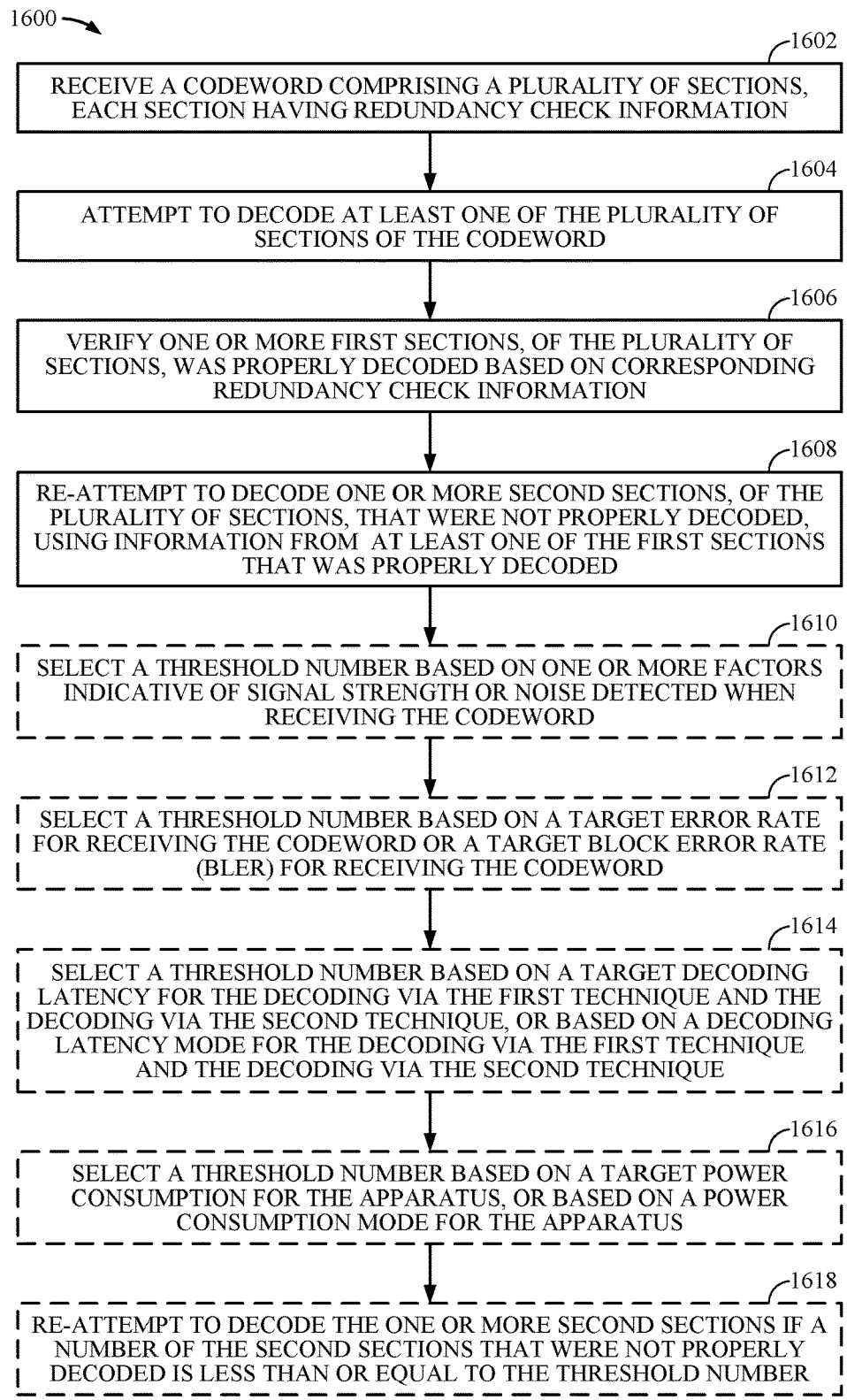
FIG. 16 illustrates example operations for wireless communications by an apparatus, in accordance with certain aspects of the present disclosure.

FIG. 16 illustrates example operations 1600 for wireless communications by an apparatus, for increasing decoding performance and/or reducing decoding complexity. According to certain aspects of the present disclosure, operations 1600 may be performed by an apparatus (e.g., wireless device 302). Blocks illustrated with dashed lines, such as block 1610, are optional steps in operations 1600.

Operations 1600 begin at block 1602 by the apparatus receiving a codeword comprising a plurality of sections, each section having redundancy check information. For example, receiver 312 of wireless device 302 may receive a codeword via one or more antennas 316, and the codeword may comprise a plurality of sections, with each section having redundancy check information (e.g. a CRC or parity check information).

At block 1604, the apparatus attempts to decode at least one of the plurality of sections of the codeword. Continuing the example, decoder 324 of wireless device 302 may attempt to decode a first section of the plurality of sections of the codeword.

At block 1606, the apparatus verifies one or more first sections, of the plurality of sections, was properly decoded based on corresponding redundancy check information. Still in the example from above, the decoder 324 or the processor 304 of the wireless device 302 may verify the first section of the codeword was properly decoded, based on redundancy check information (e.g., CRC or parity check information) corresponding to the first section of the codeword.

At block 1608, the apparatus re-attempts to decode one or more second sections, of the plurality of sections, that were not properly decoded, using information from at least one of the first sections that was properly decoded. Continuing the example from above, the decoder 324 may re-attempt to decode a second one or more sections that were not properly decoded, using information from the first section of the codeword.

The apparatus may optionally, at block 1610, select a threshold number based on one or more factors indicative of signal strength or noise detected when receiving the codeword. Continuing the example from above, the decoder 324 or the processor 304 of the wireless device 302 may select a threshold number of 1, based on an SNR detected when the wireless device is receiving the codeword.

At block 1612, the apparatus may optionally select a threshold number based on a target error rate for receiving the codeword or a target block error rate (BLER) for receiving the codeword. Still in the example from above, the decoder 324 or the processor 304 of the wireless device 302 may select a threshold number of 1, based on a target BLER for receiving the codeword.

The apparatus may optionally, at block 1614, select a threshold number based on a target decoding latency for the decoding via a first technique and the decoding via a second technique, or based on a decoding latency mode for the decoding via the first technique and the decoding via the second technique, wherein the attempting to decode in block 1604 comprises attempting to decode via the first technique and the re-attempting to decode in block 1608 comprises attempting to decode via the second technique. Continuing the example from above, the decoder 324 or the processor 304 of the wireless device 302 may select a threshold number of 1, based on a target decoding latency for the decoding via the first technique and the decoding via the second technique.

At block 1616, the apparatus may optionally select a threshold number based on a target power consumption for the apparatus, or based on a power consumption mode for the apparatus. Still in the example from above, the decoder 324 or the processor 304 of the wireless device 302 may select a threshold number of 1, based on the device being in a low power mode.

The apparatus may optionally, at block 1618, re-attempt to decode the one or more second sections if a number of the second sections that were not properly decoded is less than or equal to the threshold number (e.g., the threshold number optionally selected in one of blocks 1610, 1612, 1614, and 1616). Continuing the example from above, the decoder 324 of the wireless device 302 may re-attempt to decode one second section, if the number of the second sections that were not properly decoded is less than or equal to the threshold number of 1 (e.g., selected in one of blocks 1610, 1612, 1614, and 1616).

According to aspects of the present disclosure, if a device determines to perform reinforced list decoding on a section (e.g., the section did not pass a CRC check after being decoded with a short-list LVA technique or a non-LVA technique), then the device may perform CC, TBCC, or polar LVA decoding (e.g., re-attempting to decode, as illustrated in block 1608 in FIG. 16) on that section.

In aspects of the present disclosure, a device may attempt to decode (e.g., as illustrated in block 1604) a section of the codeword using an LVA with a first list length (e.g., a first list size), and, if the device does not properly decode the section, then the device may re-attempt to decode the section (e.g., as illustrated in block 1608) using an LVA with a second list length longer than the first list length.

Figure 17:
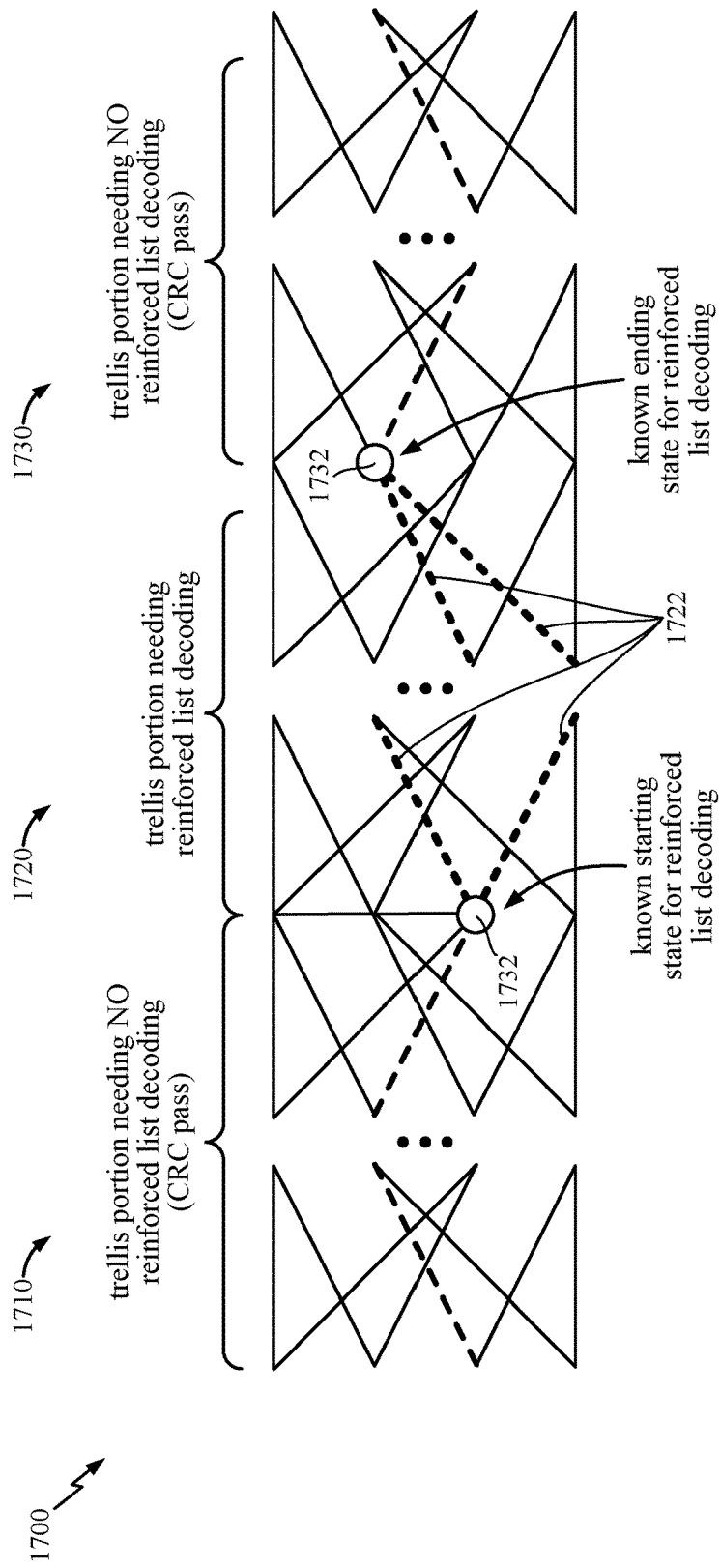
FIG. 17 illustrates an exemplary trellis for list Viterbi algorithm (LVA) decoding, in accordance with certain aspects of the present disclosure.

FIG. 17 illustrates an exemplary trellis 1700 for LVA decoding. According to aspects of the present disclosure, a process for CC/TBCC LVA decoding may be as follows:

(1) Find the tail state (e.g., trellis ending state) 1712 of the survival path in a section 1710 immediately preceding the section 1720 for which CC/TBCC LVA decoding is being performed. If the immediately preceding section 1710 also fails its sectional CRC, then find the tail state of the survival path of a section immediately preceding the preceding section 1710. In the case of TBCC, the sequence of sections of the codeword may be treated as a circular sequence. That is, the last section of the codeword may be treated as being immediately preceding the first section of the codeword. In the case of CC, the sequence of sections may also be treated as circular except that the tail state of the final section is always 0.

(2) Given the found tail state from the immediately preceding passing section 1710, construct a CC or TBCC LVA trellis for the section 1720 to use in decoding the section 1720. Using a tail state of a preceding section in constructing a trellis for a current section may be an example of re-attempting to decode a second section that was not properly decoded using information from a first section that was properly decoded, as illustrated in block 1608 in FIG. 16. If any of the path candidates 1722 through the LVA trellis passes the sectional CRC, then take the decoded bits of the path candidate passing the sectional CRC as being the correct decoding of the section 1720 and declare the section 1720 as passing the sectional CRC.

(3) Repeat the process above for each of the M (M<=$M_T$) sections (e.g., section 1720 and other sections failing their respective sectional CRCs) until all M sections pass their respective sectional CRCs.

According to aspects of the present disclosure, a device performing reinforced list decoding on a second section may use the known starting state of a first section immediately after the second section in the reinforced list decoding. Using a starting state of a succeeding section in constructing a trellis for a current section may be an example of re-attempting to decode a second section that was not properly decoded using information from a first section that was properly decoded, as illustrated in block 1608 in FIG. 16. The device may determine not to consider a path candidate through an LVA trellis if the ending state of the path candidate is not the same as the starting state of the second section immediately after the first section. For example and with reference to FIG. 17, a device performing LVA decoding on the section 1720 may determine to not consider (e.g., not calculate CRCs for) any of the path candidates 1722 that do not have an ending state matching the starting state 1732 of the section 1730 that is immediately after section 1720. Thus, a device performing decoding according to aspects of the present disclosure may not need to additionally estimate starting and ending states for the trellis portion(s) of section (s) that need reinforced list decoding.

In the case of either CC or TBCC, as long as the previous (e.g., previous in a circular arrangement of sections) section passes its sectional CRC, the starting state of the trellis for the current section is known. Using a tail state of a preceding section in constructing a trellis for a current section may be an example of re-attempting to decode a second section that was not properly decoded using information from a first section that was properly decoded, as illustrated in block 1608 in FIG. 16. The CC or TBCC LVA decoding for the current section can therefore be more efficient than blindly starting trellis construction with equal state metrics.

With a suitably chosen number of sections, N, and threshold number of sections that can fail initial decoding without declaring a decoding failure, $M_T$, the block error rate (BLER) performance of the disclosed decoding techniques (e.g., reinforced list decoding) may be configured to be reasonably close to that of a legacy CC or TBCC encoding and decoding scheme. Thus, a device determining a threshold number based on a target BLER for decoding according to disclosed techniques matching a BLER of legacy CC or TBCC decoding may be an example of selecting a threshold number based on a target error rate for receiving the codeword or a target block error rate (BLER) for receiving the codeword, as illustrated in block 1612 of FIG. 16. The false detection probability may be somewhat better than a legacy LVA decoding technique.

The bit error ratio (BER) behavior of TBCC is known to be flat over all payload bit indices, which is compatible with the disclosed decoding techniques.

According to aspects of the present disclosure, reinforced list decoding may decrease the complexity of decoding operations as compared to LVA decoding of an entire codeword, while having approximately the same success rate as LVA decoding of the entire codeword.

In previous decoding techniques, a significant fraction of codeword decoding failures are in the form of M sectional failures, where M<=$M_T$, with $M_T$ suitably chosen (e.g., as illustrated in blocks 1610, 1612, 1614, and 1616 of FIG. 16).

A comparison of decoding complexity between previous decoding techniques and the techniques described in this disclosure (e.g., reinforced list decoding) may be as follows. In the case of M=0 (that is, none of the sections fail their respective sectional CRCs), the decoding complexity is the same decoding complexity as with non-LVA decoding. Because non-LVA decoding is of lower complexity than LVA decoding, reinforced list decoding as described in this disclosure is of lower complexity than LVA decoding when M=0.

In the case of M>$M_T$, the decoding complexity of the disclosed techniques is the same decoding complexity as with non-LVA decoding, because a device that determines that a number of sections higher than the threshold have failed sectional CRCs declares a decoding failure for the codeword, just as a device performing non-LVA would declare a decoding failure for the codeword in the same situation. Thus, reinforced list decoding as described in this disclosure is of lower complexity than LVA decoding when M>$M_T$.

In the case when 0<M<=$M_T$, the decoding complexity is the same decoding complexity as with non-LVA decoding for the N-M sections that pass their sectional CRCs, and the decoding complexity is the same or lower decoding complexity than LVA decoding for the M sections that fail their sectional CRCs. Thus, reinforced list decoding as described in this disclosure is of lower decoding complexity than LVA decoding when 0<M<=$M_T$.

Figure 18:
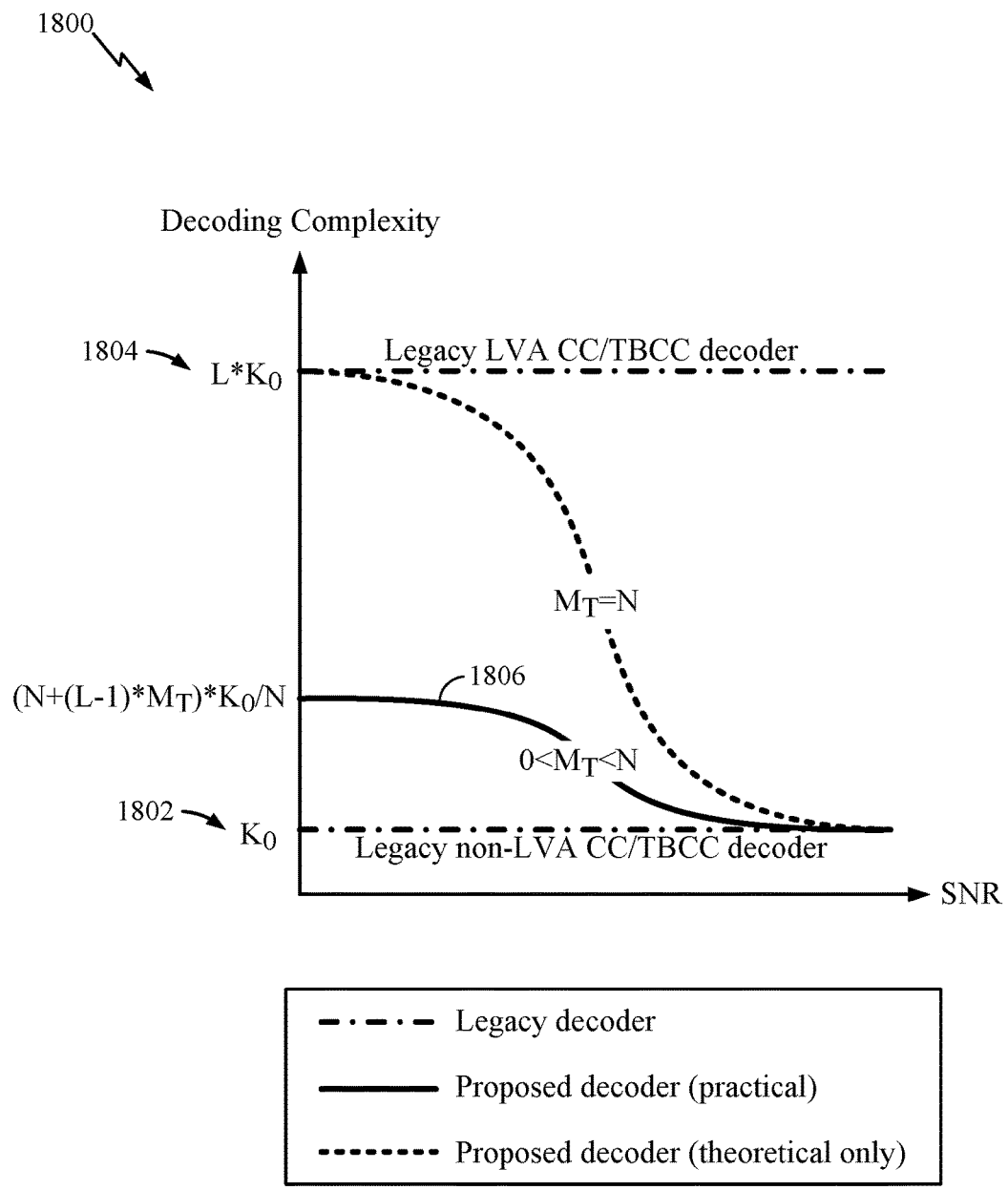
FIG. 18 illustrates comparisons of decoding complexity between previous decoding techniques and techniques described in this disclosure.

FIG. 18 illustrates comparisons of decoding complexity between previous decoding techniques and techniques described in this disclosure (e.g., reinforced list decoding) with a graph 1800. If the complexity of a legacy non-LVA decoder is "$K_0$", shown at 1802, and an LVA list size (e.g., an LVA list length) is "L", then it follows that the worst case complexity of the decoder of the present disclosure is (N+(L-1)*$M_T$)*$K_0$/N, as illustrated in graph 1800. A legacy non-LVA CC/TBCC decoder may be considered a special case of the proposed decoder with $M_T$=0, with the complexity of the non-LVA CC/TBCC decoder shown at 1802. A legacy LVA CC/TBCC decoder may be considered a special case of the proposed decoder with $M_T$=N, with the complexity of the legacy LVA CC/TBCC decoder shown at 1804. The decoder of the present disclosure may have a variable decoding complexity that is dependent on a signal-to-noise ratio (SNR), as shown by the curve 1806.

According to aspects of the present disclosure, a coding and decoding scheme may provide a mechanism to enable configurability for decoder behavior between two types of legacy (e.g., LVA, non-LVA) decoders. That is, a decoder operating according to disclosed techniques may operate with a lower decoding complexity than a legacy LVA decoder and higher decoding complexity than a legacy non-LVA decoder (e.g., as illustrated in FIG. 18). The decoder operating according to disclosed techniques may also have a decoding success rate that is higher than a legacy non-LVA decoder and less than or equal to a legacy LVA decoder.

In aspects of the present disclosure, an LVA decoder with a larger list length (e.g., list size) may have a better (e.g., lower) block error rate (BLER) when decoding a packet or a section of a packet than an LVA decoder with a smaller list length. For example, an LVA decoder using a list length of 1 may have a BLER of 0.21 for some transmissions in a set of conditions (e.g., SNR, channel quality), and an LVA decoder using a list length of 4 may have a BLER of 0.09 for transmissions in the same set of conditions.

According to aspects of the present disclosure and as previously described, for those decodes of codewords that have M<=$M_T$, reinforced list decoding may be performed to attempt to successfully decode the sections of codewords that fail decoding (e.g., fail a sectional redundancy check) on the first attempt. The described reinforced list decoding may be an example of re-attempting to decode the one or more second sections if a number of the second sections that were not properly decoded is less than or equal to a threshold number, as illustrated in block 1618 of FIG. 16.

According to aspects of the present disclosure, $M_T$ may be a configurable parameter of disclosed algorithms. $M_T$ may affect both the expected decoding complexity as well as the decoding (e.g., BLER) performance.

According to aspects of the present disclosure, variable configuration or parameter adaptation for $M_T$ may be performed, which may enable variable expected decoding complexity and/or variable decoding (BLER) performance.

According to aspects of the present disclosure, $M_T$ may be adaptively configured based on signal strength of a transmission containing a codeword to be decoded or noise detected when receiving the codeword to be decoded, as illustrated in block 1610 of FIG. 16. For example, a device may determine $M_T$ based on one or more of a carrier to interference+noise ratio (CINR), a signal power (e.g., reference signal received power (RSRP)), and/or a noise power detected when receiving a codeword.

According to aspects of the present disclosure, $M_T$ may be adaptively configured based on a target error rate or BLER for decoding of codewords, as illustrated in block 1612 of FIG. 16. For example, in a high reliability mission mode in which the target for signaling reliability is very high (i.e., the target error rate is very low), a decoder of a device may adaptively configure $M_T$ to be larger (e.g., $M_T$=N) than $M_T$ is in other modes to lower the BLER to match a target BLER. If and when the device exits the high reliability mission mode, the device may reconfigure $M_T$ to a regular (e.g., $M_T$<N) value. Note that in the case of $M_T$=N, LVA decoding is used for the entire codeword when at least one section fails a sectional redundancy check.

According to aspects of the present disclosure, $M_T$ may be adaptively configured based on a target or mode for decoding latency, as illustrated in block 1614 of FIG. 16. That is, a device may change an $M_T$ in use during decoding of codewords to reach a target decoding latency. Additionally or alternatively, a device may be able to operate in one of several modes that are related to decoding latency, and the device may adapt $M_T$ based on the mode in which the device is currently operating.

According to aspects of the present disclosure, $M_T$ may be adaptively configured based on a target or mode for power consumption, as illustrated in block 1616 of FIG. 16. That is, a device may change an $M_T$ in use during decoding of codewords to reach a target power consumption rate for decoding. Additionally or alternatively, a device may be able to operate in one of several modes that are related to power consumption, and the device may adapt $M_T$ based on the power consumption mode in which the device is currently operating. For example, a device may be operating in a power saving mode, and the device may adaptively configure $M_T$ such that a smaller (e.g., $M_T$=0) is used. Note that in the case of $M_T$=0, all sections need to pass their associated redundancy check in order to declare a decoding success, and if a section fails a sectional redundancy check, the device declares a decoding failure and takes appropriate action (e.g., requesting retransmission), rather than expending power attempting LVA decoding of the codeword.

According to aspects of the present disclosure, non-list polar decoding (e.g., successive cancellation (SC) decoding) may have significantly lower latency than polar list decoding (e.g., successive cancellation list (SCL) decoding).

In aspects of the present disclosure, during decoding (e.g., polar decoding), if a number of sections, less than a predefined threshold number (e.g., $M_T$) of sections, fail sectional CRC and/or parity checks, then the decoder may perform reinforced list decoding starting from the first CRC-failing or parity-failing section.

Figure 19:
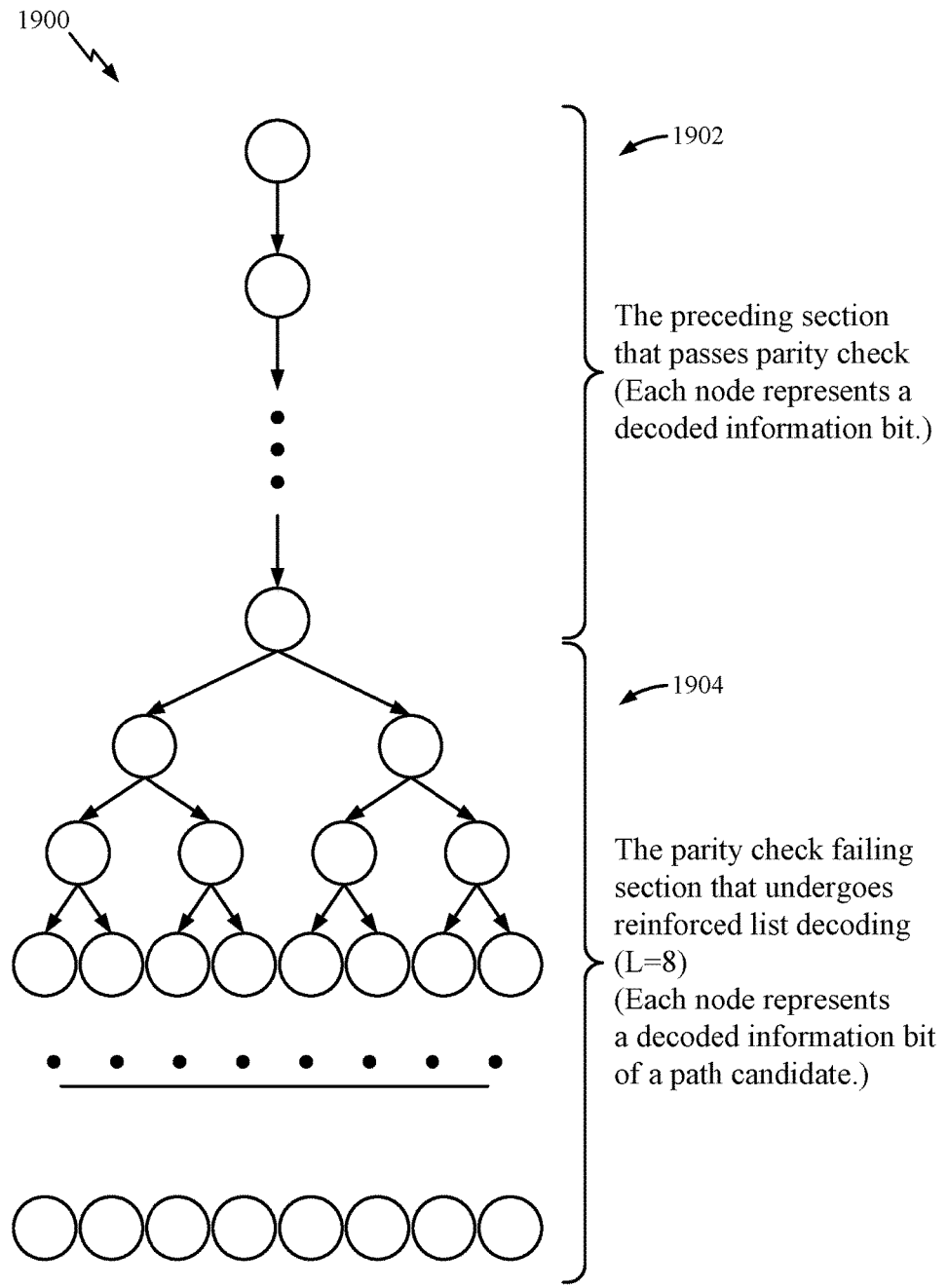
FIG. 19 illustrates an example iterative process for decoding a polar encoded bit stream.

FIG. 19 is a diagram 1900 illustrating using reinforced list decoding, as described above. The decoder successfully decodes a section 1902 using non-list polar decoding, and the section 1902 passes a CRC and/or parity check. The decoder then attempts to decode a next section using non-list polar decoding. The next section fails a CRC and/or parity check, so the decoder then attempts polar list decoding on the next section, as illustrated at 1904.

According to aspects of the present disclosure, during reinforced decoding, if at least one path candidate passes the CRC and/or parity check of the first failing section, then a decoder (e.g., decoder 324 of wireless device 302, shown in FIG. 3) may prune the CRC-failing and/or parity-failing path candidates and resume decoding for those passing path candidates (i.e., the unpruned path candidates) into a subsequent section(s) until the end of the codeword.

In aspects of the present disclosure, if no path candidates pass a sectional CRC and/or parity check for a section, then the decoder may optionally declare a decoding failure with early termination. If the decoder declares a decoding failure, then the decoding device may take appropriate action, such as transmitting a request for a retransmission of the failing section or of the codeword.

Figure 20:
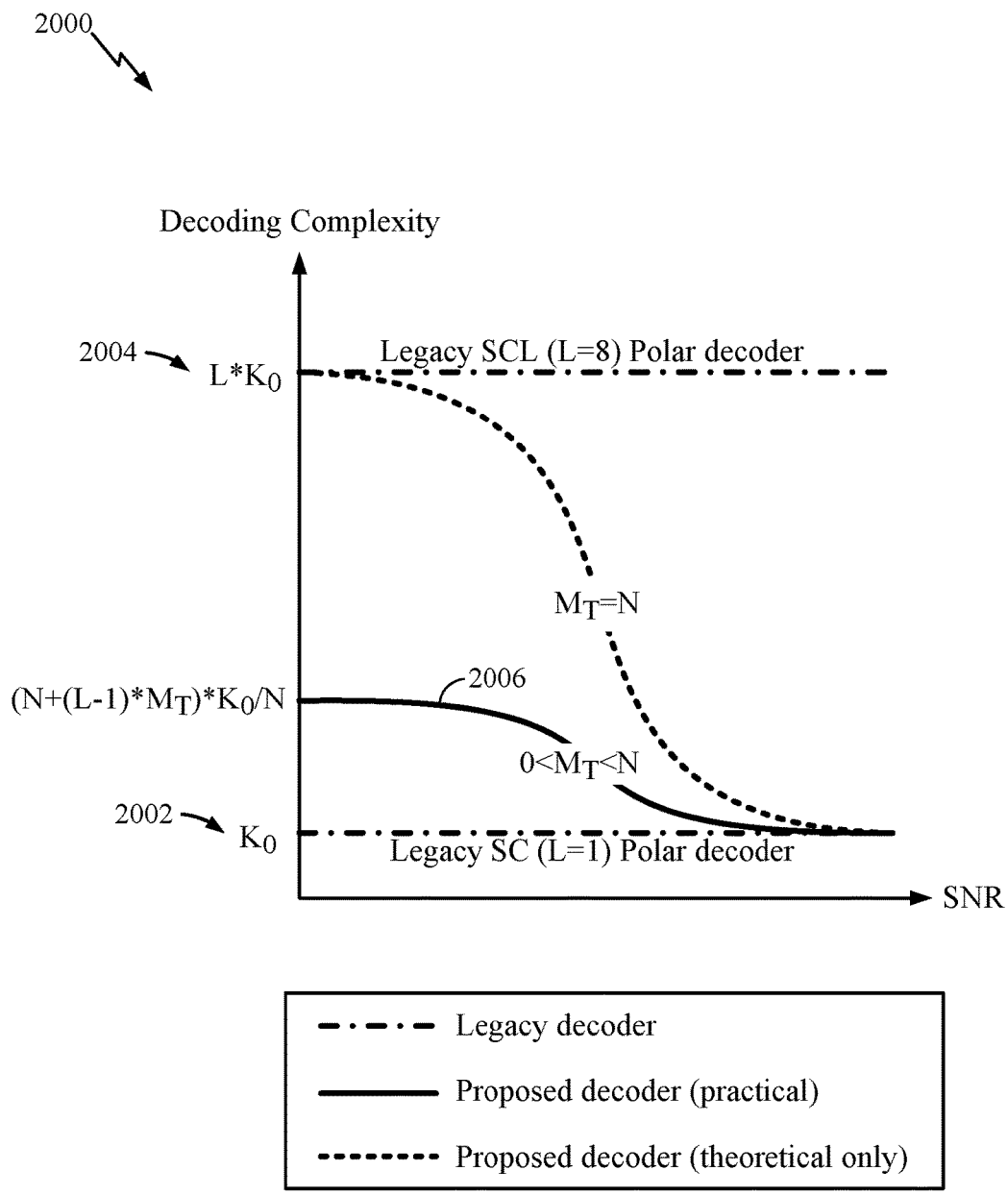
FIG. 20 illustrates comparisons of decoding complexity between previous polar decoding techniques and techniques described in this disclosure.

FIG. 20 illustrates comparisons of decoding complexity between previous decoding techniques and techniques described in this disclosure (e.g., reinforced list polar decoding) with a graph 2000. If the complexity of a legacy non-list polar decoder is "$K_0$", shown at 2002, and a list size for list polar decoding is "L", then it follows that the worst case complexity of the decoder of the present disclosure is $(N+(L-1)*M_T)*K_0/N$, as illustrated in graph 2000. A legacy non-list polar decoder may be considered a special case of the proposed decoder with $M_T$=0, with the complexity of the non-list polar decoder shown at 2002. A legacy polar list decoder may be considered a special case of the proposed decoder with $M_T$=N, with the complexity of the legacy polar list decoder shown at 2004. The decoder of the present disclosure may have a variable decoding complexity that is dependent on a signal-to-noise ratio (SNR), as shown by the curve 2006.

The methods disclosed herein comprise one or more steps or actions for achieving the described methods. The method steps and/or actions may be interchanged with one another without departing from the scope of the claims. In other words, unless a specific order of steps or actions is specified, the order and/or use of specific steps and/or actions may be modified without departing from the scope of the claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application specific integrated circuit (ASIC), or processor.

For example, means for processing, means for generating, means for obtaining, means for partitioning, means for determining, means for deriving, means for merging, means for verifying, means for concatenating, means for interleaving, means for decoding, and means for encoding may comprise a processing system, which may include one or more processors, such as the TX data processor 214, the processor 230, and/or the RX data processor 242 of the access point 210 illustrated in FIG. 2 or the TX data processor 238, the processor 270, and/or the RX data processor 260 of the user equipment 250 illustrated in FIG. 2. Additionally, means for transmitting and means for receiving may comprise a TMTR/RCVR 224 of the access point 210 or a TMTR/RCVR 252 of the user equipment 250.

According to certain aspects, such means may be implemented by processing systems configured to perform the corresponding functions by implementing various algorithms (e.g., in hardware or by executing software instructions) described above.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more examples, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and BLU-RAY® media disc where disks usually reproduce data magnetically, while discs reproduce data optically with lasers. Combinations of the above should also be included within the scope of computer-readable media.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of wireless communications performed by an apparatus, comprising:
    receiving a codeword comprising a plurality of sections, each section having redundancy check information;
    attempting to decode at least one of the plurality of sections of the codeword;
    verifying one or more first sections, of the plurality of sections, was properly decoded based on corresponding redundancy check information; and
    re-attempting to decode one or more second sections, of the plurality of sections, that were not properly decoded, using information comprising a first trellis ending state corresponding to the at least one of the first sections that was properly decoded.

2. The method of claim 1, wherein the attempting to decode does not use a list Viterbi algorithm (LVA) and the re-attempting to decode comprises using an LVA.

3. The method of claim 1, wherein the attempting to decode comprises using a list Viterbi algorithm (LVA) with a first list length and the re-attempting to decode comprises using an LVA with a second list length longer than the first list length.

4. The method of claim 1, wherein the re-attempting to decode comprises determining a first trellis starting state, corresponding to the one or more second sections, based on the first trellis ending state.

5. The method of claim 1, wherein the information from the at least one of the first sections that was properly decoded comprises a first trellis starting state corresponding to the at least one of the first sections that was properly decoded.

6. The method of claim 5, wherein the re-attempting to decode comprises determining a first trellis ending state, corresponding to the one or more second sections, based on the first trellis starting state.

7. The method of claim 1, further comprising:
selecting a threshold number based on one or more factors indicative of signal strength or noise detected when receiving the codeword; and
re-attempting to decode the one or more second sections if a number of the second sections that were not properly decoded is less than or equal to the threshold number.

8. The method of claim 7, wherein the one or more factors comprise a signal-to-noise ratio (SNR) and wherein redundancy check information of at least one section is used when re-attempting to decode the one or more second sections.

9. The method of claim 1, further comprising:
selecting a threshold number based on a target error rate for receiving the codeword or a target block error rate (BLER) for receiving the codeword; and
re-attempting to decode the one or more second sections if a number of the second sections that were not properly decoded is less than or equal to the threshold number.

10. The method of claim 1, wherein the attempting to decode comprises attempting to decode via a first technique and the re-attempting to decode comprises attempting to decode via a second technique, and the method further comprises:
selecting a threshold number based on a target decoding latency for the decoding via the first technique and the decoding via the second technique, or based on a decoding latency mode for the decoding via the first technique and the decoding via the second technique; and
re-attempting to decode the one or more second sections if a number of the second sections that were not properly decoded is less than or equal to the threshold number.

11. The method of claim 1, further comprising:
selecting a threshold number based on a target power consumption for the apparatus, or based on a power consumption mode for the apparatus; and
re-attempting to decode the one or more second sections if a number of the second sections that were not properly decoded is less than or equal to the threshold number.

12. An apparatus for wireless communications, comprising:
means for receiving a codeword comprising a plurality of sections, each section having redundancy check information;
means for attempting to decode at least one of the plurality of sections of the codeword;
means for verifying one or more first sections, of the plurality of sections, was properly decoded based on corresponding redundancy check information; and
means for re-attempting to decode one or more second sections, of the plurality of sections, that were not properly decoded, using information from at least one of the first sections that was properly decoded, wherein the information comprises a first trellis ending state corresponding to the at least one of the first sections that was properly decoded.

13. The apparatus of claim 12, wherein the means for attempting to decode does not use a list Viterbi algorithm (LVA) and the means for re-attempting to decode comprises means for using an LVA.

14. The apparatus of claim 12, wherein the means for attempting to decode comprises means for using a list Viterbi algorithm (LVA) with a first list length and the means for re-attempting to decode comprises means for using an LVA with a second list length longer than the first list length.

15. The apparatus of claim 12, wherein the means for re-attempting to decode comprises means for determining a first trellis starting state, corresponding to the one or more second sections, based on the first trellis ending state.

16. The apparatus of claim 12, wherein the information from the at least one of the first sections that was properly decoded comprises a first trellis starting state corresponding to the at least one of the first sections that was properly decoded.

17. The apparatus of claim 16, wherein the means for re-attempting to decode comprises means for determining a first trellis ending state, corresponding to the one or more second sections, based on the first trellis starting state.

18. The apparatus of claim 12, further comprising:
means for selecting a threshold number based on one or more factors indicative of signal strength or noise detected when receiving the codeword, and wherein the means for re-attempting to decode the one or more second sections comprises means for re-attempting to decode the one or more second sections if a number of the second sections that were not properly decoded is less than or equal to the threshold number.

19. The apparatus of claim 18, wherein the one or more factors comprise a signal-to-noise ratio (SNR) and wherein the means for re-attempting to decode the one or more second sections comprises means for using redundancy check information of at least one section.

20. The apparatus of claim 12, further comprising:
means for selecting a threshold number based on a target error rate for receiving the codeword or a target block error rate (BLER) for receiving the codeword, and wherein the means for re-attempting to decode the one or more second sections comprises means for re-attempting to decode the one or more second sections if a number of the second sections that were not properly decoded is less than or equal to the threshold number.

21. The apparatus of claim 12, wherein the means for attempting to decode comprises means for attempting to decode via a first technique and the means for re-attempting to decode comprises means for attempting to decode via a second technique, and the apparatus further comprises:

means for selecting a threshold number based on a target decoding latency for the decoding via the first technique and the decoding via the second technique, or based on a decoding latency mode for the decoding via the first technique and the decoding via the second technique, and wherein the means for re-attempting to decode the one or more second sections comprises means for re-attempting to decode the one or more second sections if a number of the second sections that were not properly decoded is less than or equal to the threshold number.

22. The apparatus of claim 12, further comprising:
means for selecting a threshold number based on a target power consumption for the apparatus, or based on a power consumption mode for the apparatus, and wherein the means for re-attempting to decode the one or more second sections comprises means for re-attempting to decode the one or more second sections if a number of the second sections that were not properly decoded is less than or equal to the threshold number.

23. An apparatus for wireless communications, comprising:
a processing system configured to:
receive a codeword comprising a plurality of sections, each section having redundancy check information;
attempt to decode at least one of the plurality of sections of the codeword;
verify one or more first sections, of the plurality of sections, was properly decoded based on corresponding redundancy check information; and
re-attempt to decode one or more second sections, of the plurality of sections, that were not properly decoded, using information from at least one of the first sections that was properly decoded, wherein the information comprises a first trellis ending state corresponding to the at least one of the first sections that was properly decoded; and
a memory coupled with the processing system.

24. The apparatus of claim 23, wherein the processing system is configured to:
attempt to decode the at least one of the plurality of sections without using a list Viterbi algorithm (LVA); and
re-attempt to decode the one or more second sections that were not properly decoded by using an LVA.

25. The apparatus of claim 23, wherein the processing system is configured to:
attempt to decode the at least one of the plurality of sections using a list Viterbi algorithm (LVA) with a first list length; and
re-attempt to decode the one or more second sections that were not properly decoded by using an LVA with a second list length longer than the first list length.

26. A non-transitory computer-readable medium for wireless communications, the medium comprising instructions that, when executed by a processing system, cause the processing system to execute operations comprising:
receiving a codeword comprising a plurality of sections, each section having redundancy check information;
attempting to decode at least one of the plurality of sections of the codeword;
verifying one or more first sections, of the plurality of sections, was properly decoded based on corresponding redundancy check information; and
re-attempting to decode one or more second sections, of the plurality of sections, that were not properly decoded, using information from at least one of the first sections that was properly decoded, wherein the information comprises a first trellis ending state corresponding to the at least one of the first sections that was properly decoded.

27. The computer-readable medium of claim 26, wherein the instructions include instructions to cause the processing system to:
attempt to decode the at least one of the plurality of sections without using a list Viterbi algorithm (LVA); and
re-attempt to decode the one or more second sections using an LVA.

28. The computer-readable medium of claim 26, wherein the instructions include instructions to cause the processing system to:
attempt to decode the at least one of the plurality of sections using a list Viterbi algorithm (LVA) with a first list length; and
re-attempt to decode the one or more second sections using an LVA with a second list length longer than the first list length.

* * * * *